United States Patent [19]
Yogo et al.

[11] Patent Number: 5,939,953
[45] Date of Patent: Aug. 17, 1999

[54] E-H MATCHING DEVICE AND APPARATUS AND METHOD FOR AUTOMATICALLY MATCHING MICROWAVE IMPEDANCE

[75] Inventors: Toshiya Yogo; Atsushi Okuda, both of Kasugai; Masaaki Yano; Tomoyuki Mori, both of Tokyo, all of Japan

[73] Assignee: Fujitsu Limited, Kawasaki, Japan

[21] Appl. No.: 08/946,004

[22] Filed: Oct. 7, 1997

[30] Foreign Application Priority Data

Oct. 8, 1996 [JP] Japan ................................ 8-267147
Sep. 29, 1997 [JP] Japan ................................ 9-264406

[51] Int. Cl.⁶ .................................................. H03H 7/40
[52] U.S. Cl. ........................... 333/17.3; 333/33; 333/253
[58] Field of Search ............................... 333/17.3, 33, 35, 333/253; 343/861

[56] References Cited

U.S. PATENT DOCUMENTS 5,041,803  8/1991  Shimohara et al. ............... 333/17.3 X
5,079,507  1/1992  Ishida et al. ....................... 333/17.3 X
5,408,690  4/1995  Ishikawa et al. ................... 333/17.3 X

FOREIGN PATENT DOCUMENTS 7-153599  6/1995  Japan .

*Primary Examiner*—Paul Gensler
*Attorney, Agent, or Firm*—Nikaido, Marmelstein, Murray & Oram LLP

[57] ABSTRACT

An E-H matching apparatus includes an E-plane branch waveguide connected to an E-plane of a waveguide body, an H-plane branch waveguide connected to an H-plane of the waveguide body, and plungers provided in the E-plane branch waveguide and the H-plane branch waveguide, respectively. The plungers are moved to establish impedance matching between the waveguide and a load. The H-plane branch waveguide has a bend portion formed in close proximity to the waveguide body.

27 Claims, 23 Drawing Sheets

E-H MATCHING DEVICE AND APPARATUS AND METHOD FOR AUTOMATICALLY MATCHING MICROWAVE IMPEDANCE

BACKGROUND OF THE INVENTION

1. Field of the Invention

The present invention relates to an automatic matching device provided in a waveguide, and more particularly, to an automatic matching device used for transmitting a microwave and reducing power losses of the microwave, which is to be transmitted to a load, by attenuating a standing wave developed in the waveguide to match the impedance of the waveguide to that of the load.

2. Description of the Related Art

It is known to provide an automatic matching device in a waveguide, which transmits a microwave generated by a magnetron to a load, in order to efficiently transmit the power of the microwave to the load by matching the impedance of the waveguide to the load. This automatic matching device efficiently transmits the power of the microwave to the load by detecting a standing wave developed in the waveguide and by automatically operating to attenuate this standing wave. In order to increase the efficiency of transmission of the microwave power to a much greater extent, the speed of automatic impedance matching operations must be increased, and the automatic matching device must be compact.

The automatic matching device includes a detector section for detecting the standing wave developed in the waveguide; a matching section for attenuating the standing wave by matching the impedance of the waveguide to that of the load; and a control section for operating the matching device in accordance with the signal received from the detector section to attenuate the standing wave.

As known matching devices, there are stub matching devices, 4-E matching devices, and E-H matching devices.

The stub matching device has two or three stubs inserted into a waveguide, and impedance matching of the waveguide to the load is performed by adjusting the lengths of the inserted portions of the stubs.

In an automatic matching device that employs such a stub matching device, the control section adjusts the lengths of the inserted portions of the stubs in accordance with the signal received from the detector section so as to match the impedance of the waveguide to that of the load.

As shown in FIGS. 1A and 1B, the 4-E matching device comprises a waveguide 1 having a rectangular cross section and four E-plane branch waveguides 3a to 3d connected to a wider side, or an E-plane 2, of the waveguide 1. Provided that one wavelength of the microwave that travels along the waveguide 1 is λg, the distance between the waveguides 3a, 3b and that between 3c, 3d is set to λg/4, and the distance between the waveguides 3b, 3c is set to 3λg/8.

A short-circuiting plunger 4, (hereinafter "short plunger") provided in each of the waveguides 3a to 3d, and the impedance of the waveguide 1 is matched to that of the load by adjusting the position of the short plunger 4 within each of the waveguides 3a to 3d.

In an automatic matching device that employs such an 4-E matching device, the control section adjusts the positions of the short plungers 4 in accordance with the signal received from the detector section so as to match the impedance of the waveguide 1 to that of the load.

As shown in FIG. 2, the conventional E-H matching device comprises the waveguide 1, an E-plane branch waveguide 5 connected to the E-plane 2 of the waveguide 1, and an H-plane branch waveguide 6 connected to an H-plane, or a narrower side of the waveguide 1. As shown in FIG. 3, a short plunger 7 is provided in each of the waveguides 5 and 6, and impedance matching of the waveguide 1 to the load is performed by adjusting the positions of the short plungers 7 in the waveguides 5 and 6 within the range of λg/2.

In an automatic matching device that employs such an E-H matching device, the control section adjusts the positions of the short plungers 7 in accordance with the signal received from the detector section so as to match the impedance of the waveguide 1 to that of the load.

The detector section detects a standing wave developed in the waveguide and outputs the result of such detection to the control section. The detector section comprises three or more detecting diodes provided along the axis of the waveguide such that the tip ends of the detecting diodes are exposed to the interior of the waveguide. Output voltages from the diodes are fed to the control section as a power-distribution signal. In accordance with this power-distribution signal, the control section detects the presence/absence of a standing wave and controls the matching device so as to attenuate the standing wave or to match the impedance of the waveguide to that of the load.

Each of the detecting diodes has a varying input-power-to-output-voltage characteristic. The input-power-to-output-voltage characteristic of the detecting diode comprises a linear region, a square-curve region, and a saturation region, in which the output voltage changes very little with respect to a variation in the input power.

If a dynamic range of the power distribution within the waveguide exceeds the liner region and reaches the square-curve region of the detecting diode, for example, the output characteristic of the diode in the square-curve region must be corrected such that it becomes the same as the output characteristic in the linear region. To this end, the output voltage of each detecting diode is corrected by an analog circuit for characteristic correction purposes, and the thus-corrected output voltage is provided to the control section.

Further, if the dynamic range of the power distribution within the waveguide increases and reaches the saturation region of the detecting diode, the analog circuit corrects the output characteristic of the diode in the saturation range such that it becomes the same as the output characteristic in the linear region. The thus-corrected voltage is output. With such a circuit configuration, even if the input power of the detecting diode increases with the result that characteristic range of the detecting diode shifts to a different range, an error in the output voltage is corrected by the analog circuit, and the thus-corrected voltage is output to the control section.

In the stub matching device of the foregoing automatic matching devices, if the power of the microwave transmitted to the load by the waveguide is increased, an electric discharge is likely to occur between the tip end of the stub and the interior surface of the waveguide. Further, if the amount of insertion of the stub is increased in order to sufficiently match the impedance of the waveguide to that of the load, an electric discharge is likely to occur between the tip end of the stub and the interior surface of the waveguide.

As a result, it is difficult to ascertain the amount of insertion of the stub in order to sufficiently guarantee the range of impedance matching and to transmit a microwave having sufficient power to the load. Accordingly, it is difficult for the stub matching device to perform impedance matching with regard to a microwave having high power. More specifically, in the case of impedance matching with regard to a microwave of 2.45 GHz, impedance matching with regard to about 2 kw is the limit of the stub matching device.

The 4-E matching device is superior to the stub matching device in terms of resistance to power. However, as shown in FIG. 1A, the four E-plane branch waveguides 3a to 3d must be provided at predetermined intervals on the E-plane of the waveguide 1. Accordingly, if the length L of the matching device is increased, the size of a three-dimensional circuit constituting the matching device is increased accordingly.

Like the 4-E matching device, the E-H matching device is superior to the stub matching device in terms of resistance to power. However, as shown in FIG. 2, the E-plane branch waveguide protrudes from the plane E in the vertical direction, whereas the H-plane branch waveguide protrudes from the plane H in the horizontal direction, which causes the three-dimensional circuit constituting the matching device to be bulky.

Further, in the E-H matching device, an unwanted high-order mode with respect to the frequency $\lambda g$ of the microwave to be transmitted is likely to be generated due to the presence of the H-plane branch waveguide, so that the power distribution of the standing wave is susceptible to disturbance. As shown in FIG. 16, at the time of a matching operation, when an attempt is made to move a normalized resistance R to a matching point P along a circle R=1 by moving the short plunger provided in the E-plane branch waveguide or to move a normalized conductance G to the matching point P along a circle G=1 by moving the short plunger provided in the H-plane branch waveguide, neither the normalized resistance R nor the normalized conductance G moves along the corresponding circle. As a result, it becomes considerably difficult for the automatic matching device, which employs such an E-H matching device, to perform automatic matching operations.

Another problem suffered by the E-H matching device is that when the detector section detects the standing wave by detecting the distribution of power in the waveguide, owing to the disturbance of the power distribution, it becomes impossible for the detector section to accurately detect the standing wave. In order to reduce the influence of the E-H matching device exerted on the detector section, the distance between the E-H matching device and the detector section must be increased. However, such a circuit configuration results in an increase in the size of the three-dimensional circuit constituting the matching device.

The detector section must correct the characteristic variation of each detecting diode by using an analog circuit. If the dynamic range of the power distribution in the waveguide extends from the linear region to the square curve region of the detecting diode, the output characteristic variation of the diode must be corrected by the analog circuit, and the power distribution must be detected in accordance with the corrected output voltage of the detecting diode. Further, if the dynamic range of the power distribution in the waveguide reaches the saturation region of the detecting diode, a corresponding output voltage variation must also be corrected by the analog circuit.

As a result, the analog circuit becomes complicated, and the adjustment of the output characteristic of the circuit becomes considerably complicated. Moreover, it is impossible to completely correct all the variations in the characteristics. Accordingly, the distribution of power in the waveguide, or the standing wave, cannot be accurately detected.

If the detecting diode must be exchanged with a new one, the analog circuit must be readjusted in accordance with the output characteristic of the new detecting diode. In contrast, if the analog circuit must be replaced with a new one, the output characteristic of the new analog circuit must be adjusted in accordance with the output characteristics of the detecting diodes to be connected to the analog circuit. As described above, replacement of the detecting diode or the analog circuit requires very complicated exchange operations.

SUMMARY OF THE INVENTION

An object of the present invention is to provide an E-H matching device that reduces the size of a three-dimensional circuit and ensures sufficient resistance to power.

Another object of the invention is to provide an automatic matching device that reduces the size of a three-dimensional circuit and accurately detects a standing wave within a waveguide.

Still another object of the invention is to provide an automatic matching device equipped with a detector section for accurately detecting the distribution of power in a waveguide by readily and accurately correcting variations in and the output characteristics of detecting diodes.

Yet another object of the invention is to provide an automatic matching device equipped with a detector section that readily adjusts the output characteristic of a detecting diode after replacement of the diode.

A further object of the invention is to provide an automatic matching device and an automatic matching method, both of which permit high-speed impedance matching.

One aspect of the apparatus invention is directed to an E-H matching apparatus for a waveguide body. The E-H matching apparatus includes: an E-plane branch waveguide connected to the waveguide body; an H-plane branch waveguide connected to the waveguide body; and plungers provided in the E-plane branch waveguide and the H-plane branch waveguide, respectively. The plungers are moved to establish impedance matching between the waveguide body and a load. The H-plane branch waveguide has a bend portion formed in close proximity to the waveguide body.

Another aspect of the apparatus invention is directed to an automatic microwave impedance-matching apparatus adapted to a waveguide body transmitting a microwave to a load. The automatic microwave impedance-matching apparatus includes: an E-H matching apparatus including an H-plane branch waveguide and H-plane branch waveguide connected to the waveguide body, the E-H matching apparatus further including plungers provided in the E-plane branch waveguide and the H-plane branch waveguide; a detector unit for detecting the distribution of power within the waveguide body; and a control unit for receiving a detection result from the detector unit and detecting a standing wave developed as a result of an impedance mismatch between the load and the waveguide body, the control unit further controlling the plungers so as to attenuate the standing wave.

One aspect of the method invention is directed to a method for automatically matching microwave impedance between a load and a waveguide. The method includes the steps of: detecting the power of the inside of the waveguide four or more points defined at intervals corresponding to one-eighth of the wavelength of the microwave to be transmitted along the waveguide and generating a plurality of detection signals; eliminating, from the detection signals, a detection signal associated with one of the points that exceeds the dynamic range of the detection signal; detecting the standing wave developed in the waveguide in accordance with the remaining detection signals; and attenuating the detected standing wave.

Another aspect of the method invention is directed to a method for automatically matching microwave impedance between a load and a waveguide. The method includes the steps of: providing an impedance matching apparatus, which is connected to the waveguide, for detecting and attenuating a standing wave developed in the waveguide, the impedance matching apparatus including a movable plunger used for attenuating the standing wave; moving the plunger at high speed when the standing wave is greater than a predetermined level; and moving the plungers at low speed when the standing wave is smaller than the predetermined level.

One aspect of the invention is directed to a recording medium suitable for use in an impedance matching apparatus adapted to a waveguide transmitting a microwave to a load. The apparatus has detecting diodes and a computer. The recording medium has a program, which includes a predetermined approximate expression, recorded therein. The program causes the computer to: compute an approximation value of input power to the waveguide using the predetermined approximate expression and output voltages of detecting diodes; compute coefficient of reflection and phase of the input power; determine whether impedances of the waveguide and the load match with each other; and execute automatic impedance matching of the impedance matching apparatus when the impedances of the waveguide and the load do not match with each other.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 4:
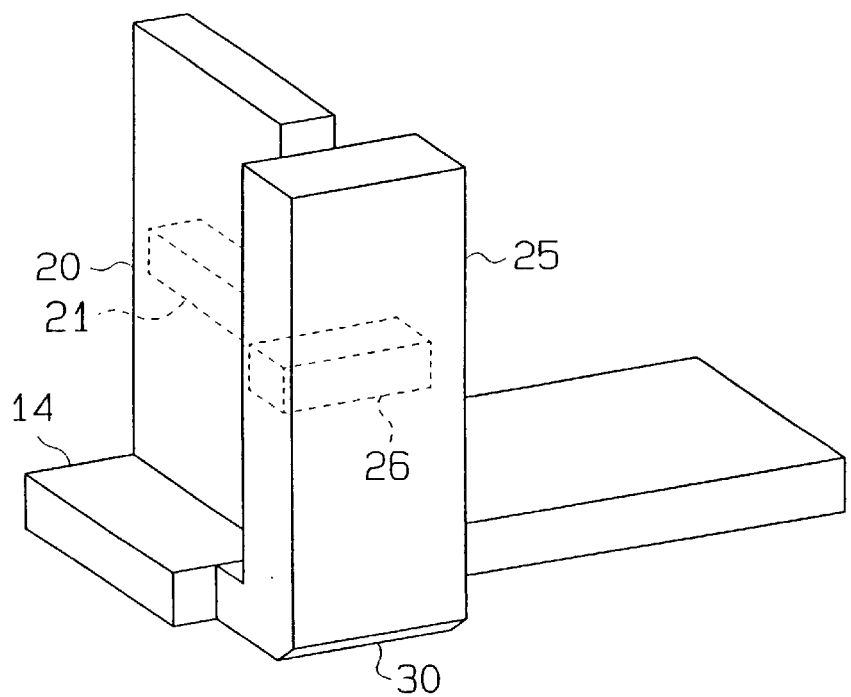
FIG. 4 is a perspective view showing the outline of an E-H matching device of the present invention.

FIG. 4 is a perspective view showing the outline of an E-H matching device according to the present invention. The E-H matching device includes a waveguide 14, an E-plane branch waveguide 20 connected to an E plane of the waveguide 14, and an H-plane branch waveguide 25 connected to an H plane of the waveguide 14. Impedance matching of the waveguide 14 to a load is effected by moving short plungers 21, 26 provided in the respective waveguides 20 and 25. The H-plane branch waveguide 25 is provided with an E-bend 30 which is formed in proximity to the waveguide 14.

FIRST EMBODIMENT

Figure 5:
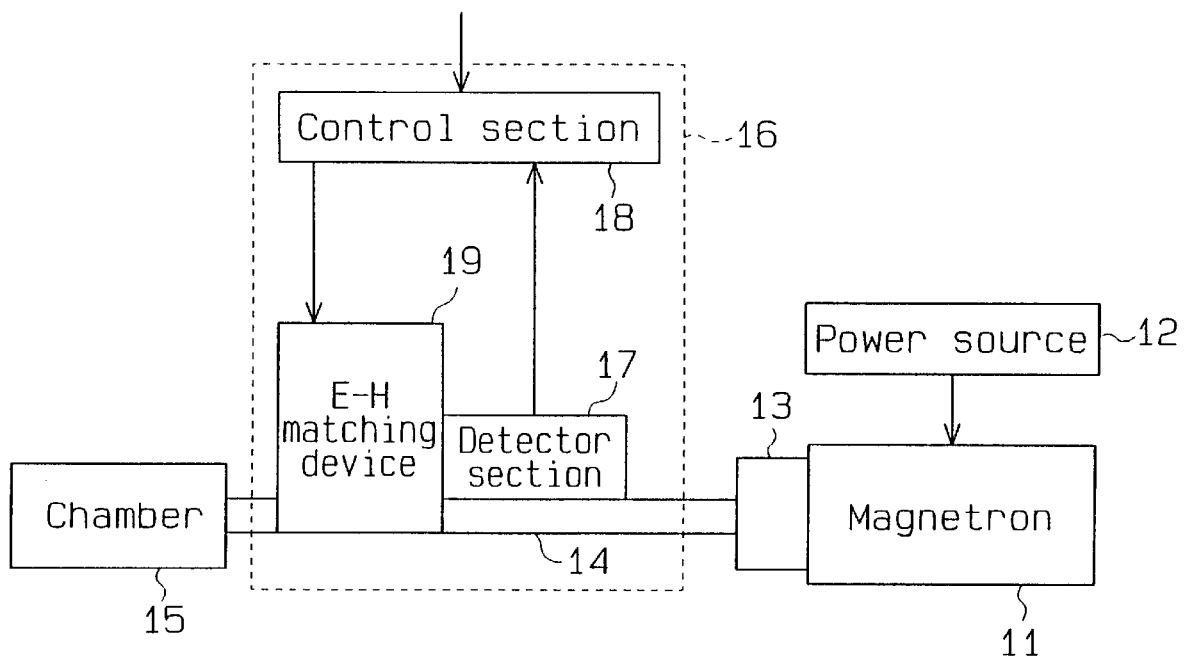
FIG. 5 is a block diagram of a plasma generator of one embodiment of the present invention.

FIG. 5 is a block diagram of a plasma generator equipped with a microwave automatic matching device. A magnetron 11 generates a microwave having a predetermined frequency when power is supplied thereto from a power source 12. The microwave is transmitted to the waveguide 14 via an isolator 13 and is further transmitted to a chamber 15 from the waveguide 14.

Plasma is generated from the thus-supplied microwave in the chamber 15 and is then used in, e.g., a process of manufacturing semiconductor devices.

An automatic impedance matching device 16 is provided for the waveguide 14 to efficiently transmit the power of the microwave to the chamber 15 by matching the impedance of the waveguide 14 to that of a load, or to that of the chamber 15.

The automatic matching device 16 comprises a detector section 17 for detecting a developed standing wave by detecting the distribution of power within the waveguide 14; a control section 18, which receives a signal from the detector section 17 and calculates and outputs a control signal for attenuating the standing wave; and an E-H matching device 19, which receives the control signal from the control section 18 and attenuates the developed standing wave in the waveguide 14 in accordance with the control signal.

The specific configuration of the E-H matching device 19 and the detector section 17 is described with reference to FIGS. 6 to 8. The E-plane branch waveguide 20 is formed on the E-plane of the waveguide 14, and, as shown in FIG. 8, an E-plane short plunger 21 is provided in the waveguide 20.

The E-plane short plunger 21 is in screw-engagement with a feed screw 22, and a pulley 23 is attached to the upper end of the feed screw 22. The pulley 23 is rotatively driven by an E-plane motor 24 via a belt. As a result of the pulley 23 being rotated by the E-plane motor 24, which is controlled in accordance with the control signal received from the control section 18, the feed screw 22 is rotated. In association with the rotation of the feed screw 22, the E-plane short plunger 21 moves up and down within the E-plane branch waveguide 20.

The H-plane branch waveguide 25 is provided on the H plane of the waveguide 14. The H-plane branch waveguide 25 is bent at the E-bend 30 so that the H-plane branch waveguide 25 extends in the vertical direction, i.e., in a direction parallel to the E-plane branch waveguide 20.

Figure 8:
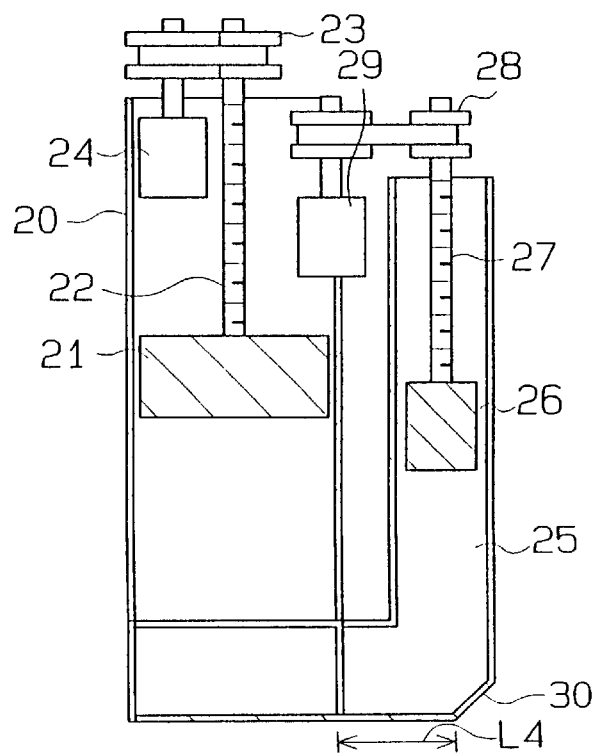
FIG. 8 is a partially sectioned side view showing the E-H matching device used in the embodiment of FIG. 6.

As shown in FIG. 8, an H-plane short plunger 26 is provided in the H-plane branch waveguide 25. The H-plane short plunger 26 is in screw-engagement with a feed screw 27, and a pulley 28 is attached to the upper end of the feed screw 27. The pulley 28 is rotatively driven by an H-plane motor 29 via a belt. As a result of the pulley 28 being rotated by the H-plane motor 29 which is controlled in accordance with the control signal received from the control section 18, the feed screw 27 is rotated. In association with the rotation of the feed screw 27, the H-plane short plunger 26 moves up and down within the H-plane branch waveguide 25.

Figure 9:
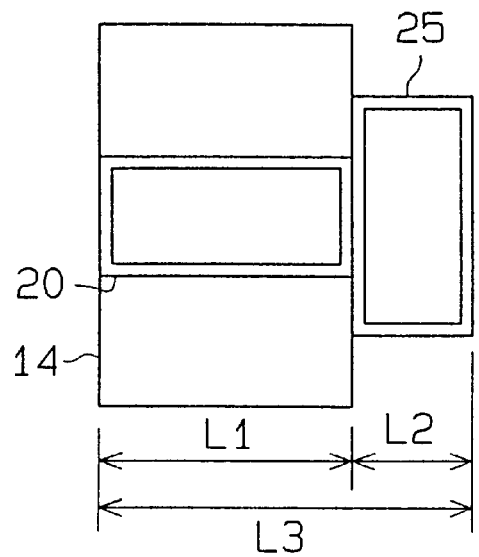
FIG. 9 is a plan view showing the E-H matching device, in which an E-bend is brought in proximity to a waveguide.

As shown in FIG. 9, if a microwave having a frequency of 2.45 GHz is to be transmitted along a WRJ-2 waveguide, the E-H matching device has a dimension L1 of the E plane measuring 108.2 mm, a dimension L2 of the H plane measuring 54.6 mm, and a distance L3 between the waveguide 14 and the H-plane branch waveguide 25 measuring 162.8 mm.

In the H-plane branch waveguide 25, provided that one wavelength of the microwave of 2.45 GHz is $\lambda g$, the distance between the E-bend 30 and the H plane of the waveguide 14 is set to $\lambda g/4$ or less. Specifically, a distance L4 (FIG. 8) between the interior surface of the H plane of the waveguide 14 and the point of the bend on the center axis of the H-plane branch waveguide 25 within the E-bend 30 is set to $\lambda g/4$ or less.

Figure 10:
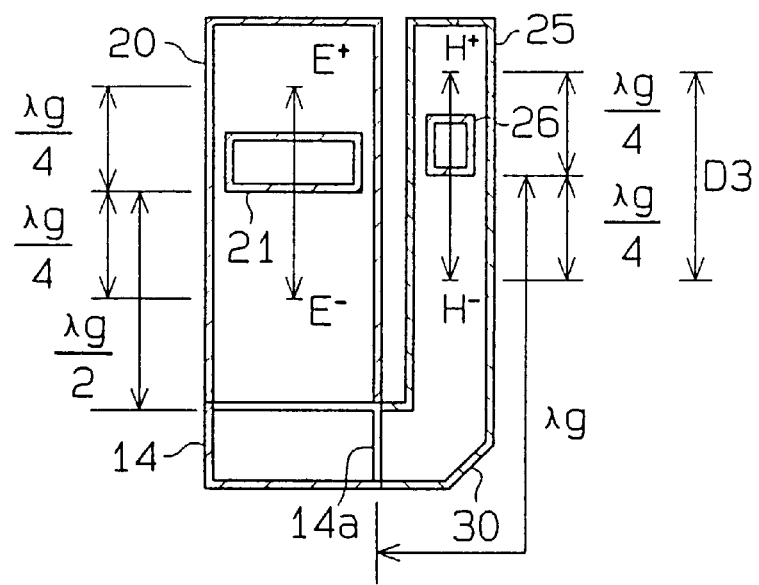
FIG. 10 is an explanatory view showing the operation of a short plunger used in the embodiment of FIG. 6.

As shown in FIG. 10, the waveguide 25 for transmitting a microwave equipped with an E-bend 30 has the effect of shortening the wavelength $\lambda g$ of the microwave passing through the E-bend 30. Further, the waveguide has the effect of removing a part of an unwanted frequency band of the microwave passing through the E-bend 30 and cuts off the disturbance of an electromagnetic field occurring along the interface between the waveguide 14 and the H-plane branch waveguide 25. Accordingly, disturbance in the distribution of power is prevented in the interior of the waveguide 14 in the vicinity of the interface between the waveguide 14 and the H-plane branch waveguide 25.

Figure 1A:
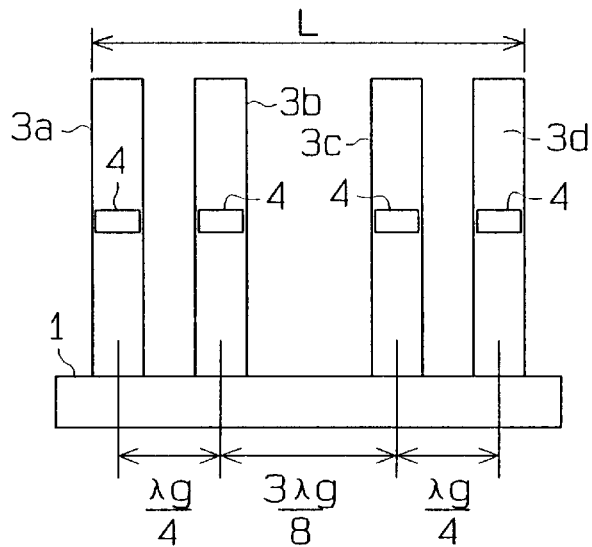
FIGS. 1A and 1B are explanatory views showing a conventional 4-E matching device.
Figure 1B:
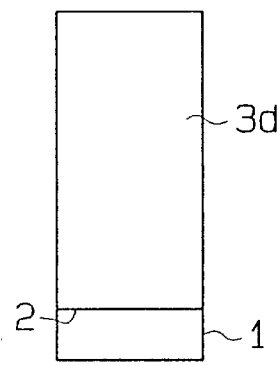
Figure 2:
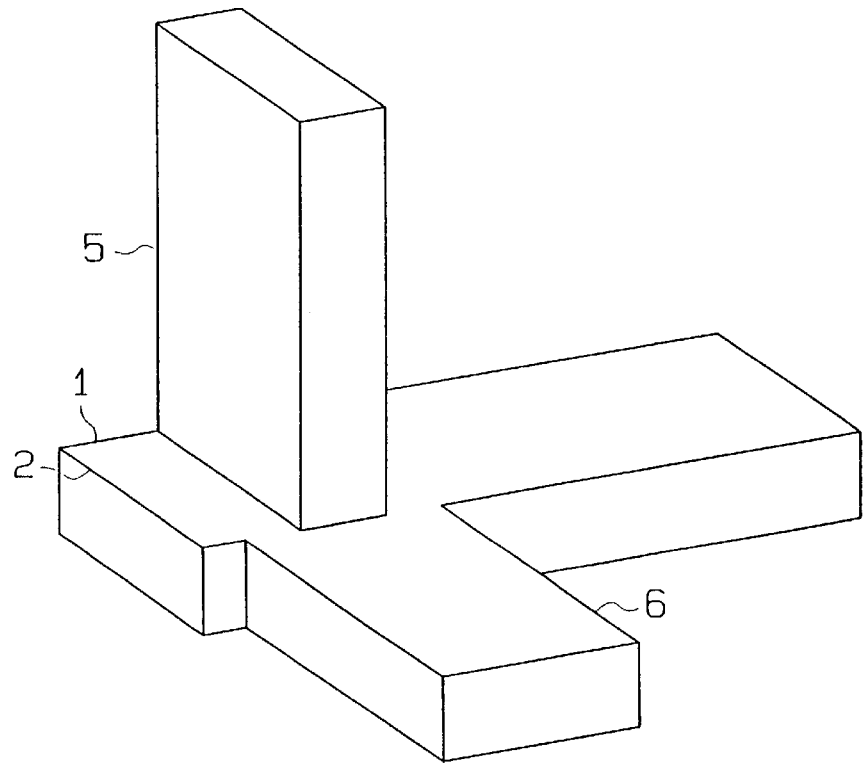
FIG. 2 is a perspective view showing a conventional E-H matching device.
Figure 3:
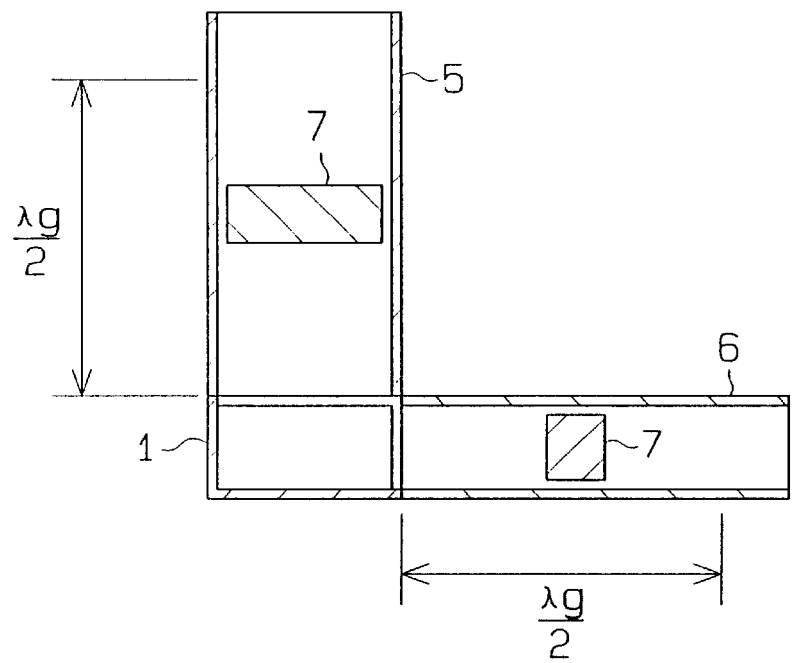
FIG. 3 is a cross-sectional view showing the conventional E-H matching device.

In the conventional E-H matching device as shown in FIG. 2, the H-plane branch waveguide 6 is ended without any bend, and a high-order mode occurs depending on the position of the H-plane short plunger. In contrast, in accordance with the present embodiment, the influence of the high-order mode is reduced by the E-bend 30, enabling improvements in the characteristics of the matching device.

Figure 11:
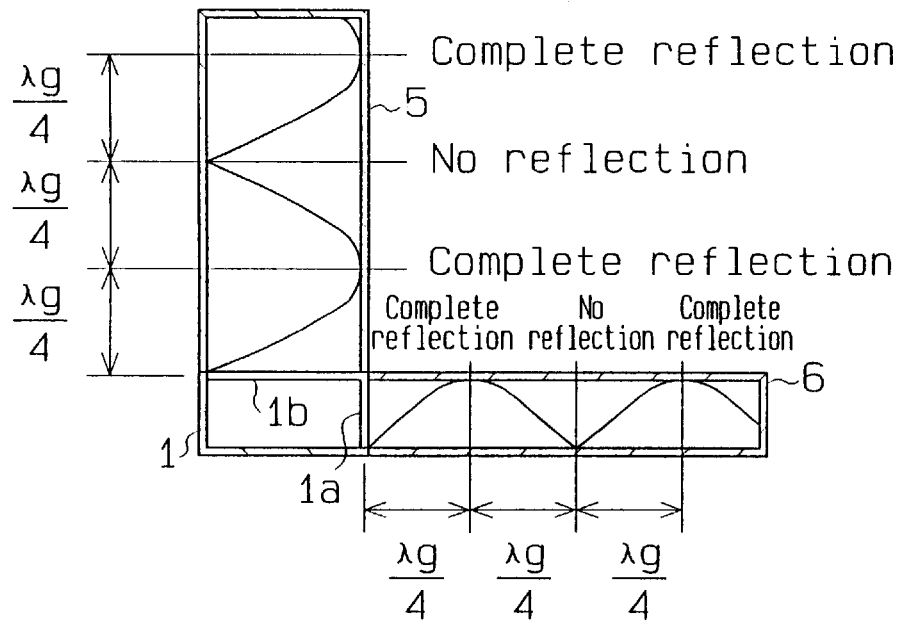
FIG. 11 is an explanatory view showing the state of a reflected waveform within the E-H matching device.
Figure 12:
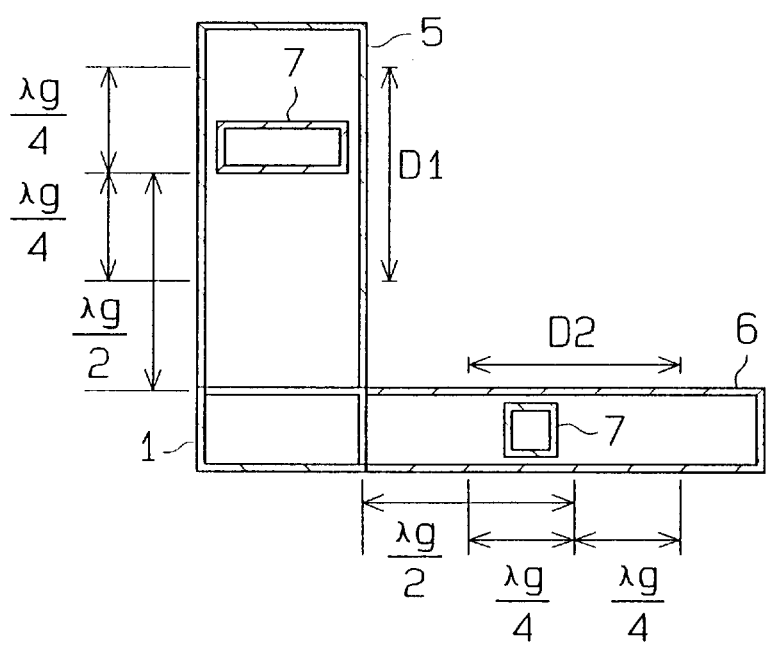
FIG. 12 is an explanatory view showing the operation of the short plunger of the E-H matching device.

FIG. 11 shows the state of reflection of a conventional E-H matching device in which the degrees of reflection when the respective short plungers are positioned at different positions are shown. In the case of the construction of a full-range matching device in which the short plungers are operated or moved while the interior surfaces 1a and 1b of the waveguide 1 are regarded as the points of origin, the plungers must pass through the positions of complete reflection. More specifically, the short plungers are usually moved while the positions of no reflection, which are spaced $\lambda g/2$ away from the interior surfaces 1a and 1b of the waveguide 1, are used as the centers of the operation ranges. In this case, full-range matching becomes feasible by movement of the short plungers 7 within the respective ranges of operation D1, D2 shown in FIG. 12.

In the present embodiment, the H-plane short plunger 26 must be moved within the operation range D3 shown in FIG. 10 because the E-bend 30 is directly connected to the interface between the waveguide 14 and the H-plane branch waveguide 25. That is, the position of no reflection must be spaced $\lambda g$ apart from the interior surface 14a of the waveguide 14. The $\lambda g$ aparting position is used as the center of the operation range D3.

The wavelength $\lambda g$ of the microwave becomes shorter by virtue of the wavelength-shortening effect of the E-bend 30. Therefore, the distance between the center of the operation range D3 of the H-plane short plunger 26 and the interior surface 14a of the waveguide 14 is shortened. As a result, the length of the H-plane branch waveguide 25 is reduced.

Figure 6:
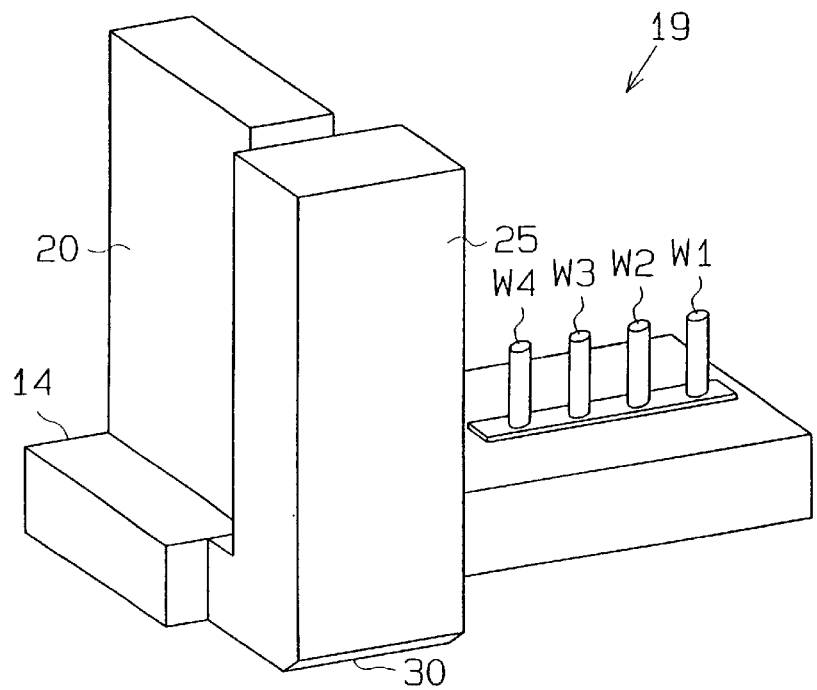
FIG. 6 is a perspective view showing an E-H matching device used in one embodiment of the invention.
Figure 7:
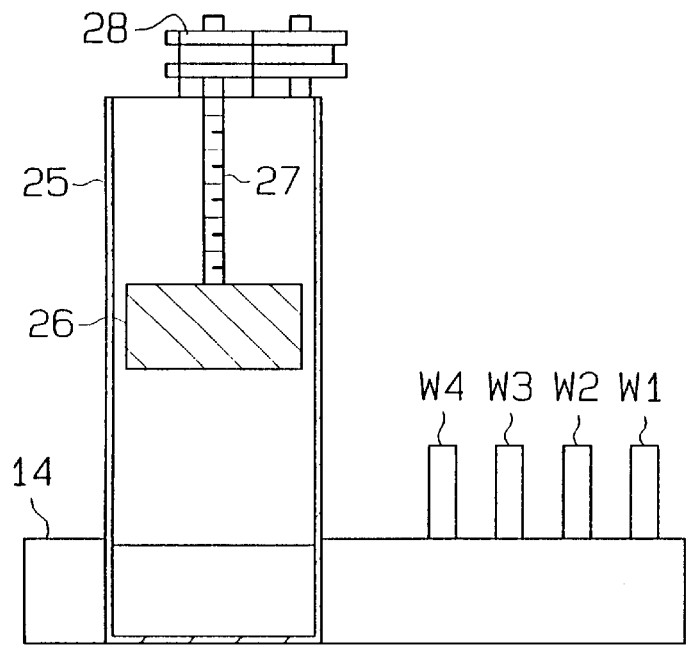
FIG. 7 is a partially sectioned front view showing the E-H matching device used in the embodiment of FIG. 6.

As shown in FIGS. 6 and 7, four detecting diodes W1 to W4 are arranged on the E plane of the waveguide 14 in the vicinity of the E-plane branch waveguide 20 such that they are arranged in a line at intervals of $\lambda g/8$ in the axial direction of the waveguide 14. The tip ends of the detecting diodes W1 to W4 are exposed inside the waveguide 14. Each of the detecting diodes W1 to W4 detects input power in accordance with the distribution of power within the waveguide 14 and outputs to the control section 18 a voltage corresponding to the input power. Here, the detecting diodes W1 to W4 need not be spaced with the interval of $\lambda g/8$. Also, the diodes W1 to W4 need not be arranged in a line as shown.

Figure 14:
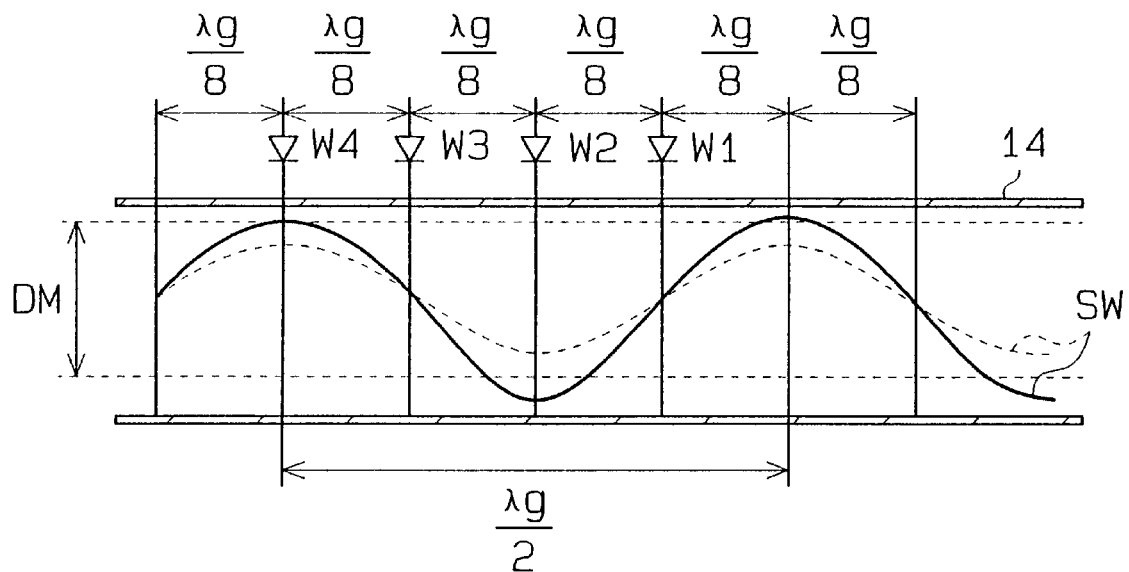
FIG. 14 is an explanatory diagram showing the operation of a detector section.

As shown in FIG. 14, the wavelength of the standing wave SW developed in the waveguide 14 becomes $\lambda g/2$. Since the four detecting diodes W1 to W4 are provided at intervals of $\lambda g/8$, at least three of the detecting diodes do not correspond to the valley of the standing wave SW. Accordingly, the distribution of power within the waveguide 14 is accurately detected in accordance with the voltages output from the three detecting diodes that do not correspond to the valley of the standing wave SW, and the standing wave SW can be accurately detected.

If a detecting diode W1 to W4 corresponds to the valley of the standing wave SW, the power level of the standing wave may exceed the dynamic range DM of the detecting diode. However, in this embodiment at least three of the four detecting diodes W1 to W4 do not correspond to the valley of the standing wave SW.

In a case where none of the detecting diodes W1 to W4 correspond to the valley of the standing wave SW, in consideration of the disturbance of an electric field occurring in the interface between the waveguide 14 and the H-plane branch waveguide 25, the distribution of power is detected in accordance with the voltages output from the three detecting diodes W1 to W3 provided away from the interface, and the standing wave SW can be more accurately detected.

Figure 13:
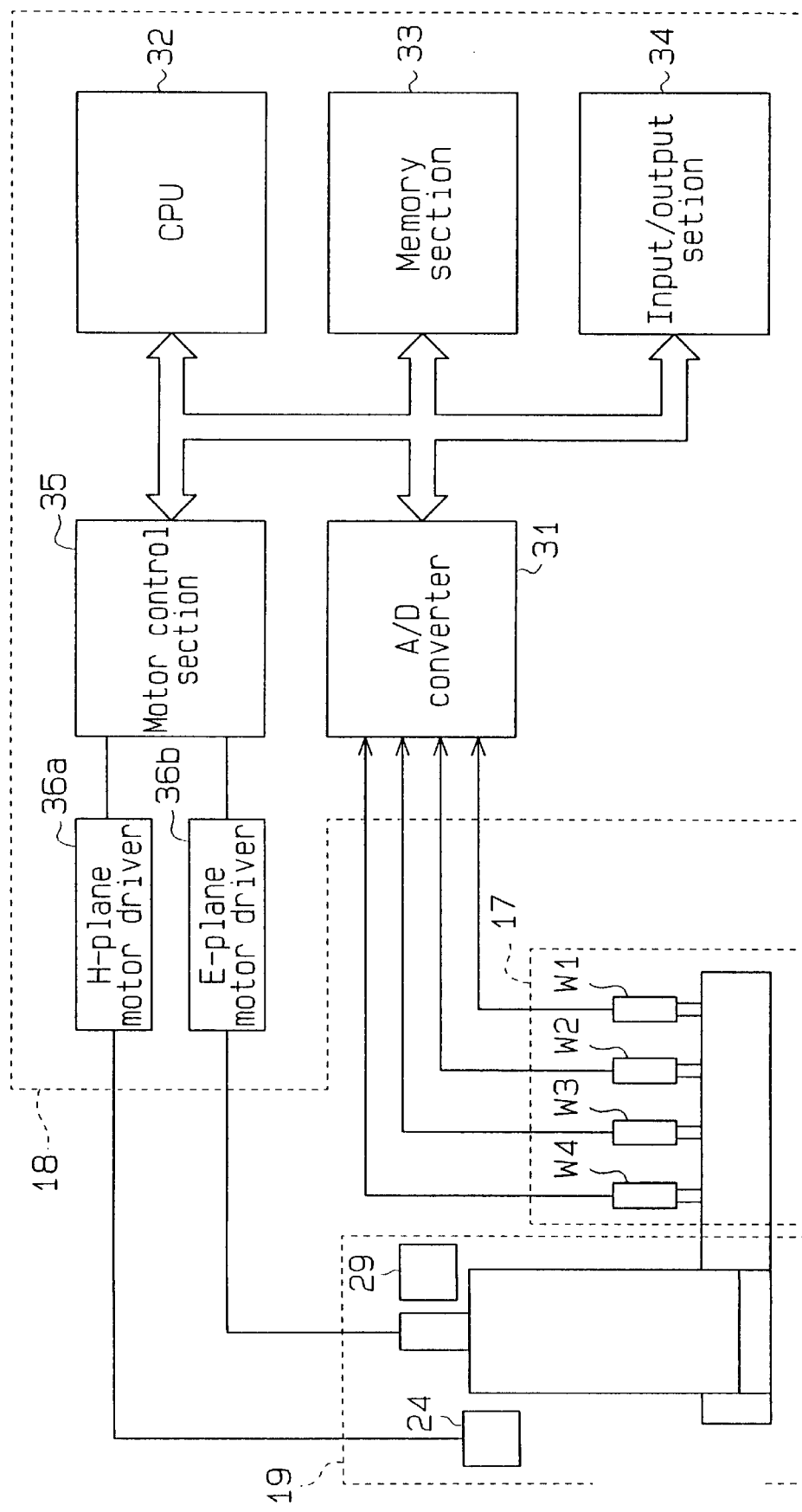
FIG. 13 is a block diagram showing an automatic matching device of the present invention.

The specific configuration of the control section 18 is described with reference to FIG. 13. The voltages output from the detecting diodes W1 to W4 are converted from analog to digital by an A/D converter 31, and the thus-converted signals are sent to a CPU 32.

A memory section 33 is connected to the CPU 32 and stores a program used for causing the E-H matching device to automatically match the impedance of the waveguide 14 to that of the chamber 15.

This memory section 33 further stores an approximate expression used for calculating the power input to each of the detecting diodes W1 to W4 in accordance with the voltage output from each of the detecting diodes W1 to W4. More specifically, the memory section 33 stores an approximate expression used for calculating input power while compensating for the output characteristic variations of the detecting diodes W1 to W4 and variations in the output voltage ranging across the linear, square curve, and saturation regions. Based on the relationship between the input power and the output voltage previously measured with regard to each of the detecting diodes W1 to W4, the approximate expression is determined such that the relationship between the input power and the output voltage is accurately obtained even if the relationship between the input power and the output voltage is nonlinear. Accordingly, the number of detecting diodes is not necessarily limited to four. Since the input power is calculated from the output voltage of each detecting diode by the approximate expression, any number of detecting diodes can be provided, as long as at least three detecting diodes are provided.

The CPU 32 is connected to a motor control section 35 and input/output section 34. The motor control section 35 inputs control signals output from the CPU 32 and outputs motor control signals to an H-plane motor driver 36a and an E-plane motor driver 36b in accordance with the control signals. The drivers 36a, 36b respectively drive an H-plane motor 29 and an E-plane motor 24 in accordance with the motor control signals.

Connected to a CPU 32 are an input/output section 34 and a motor control section 35, which receives a control signal output from the CPU 32. Based on the control signal, the motor control section 35 sends a motor control signal to an H-side motor driver 36a and an E-side motor driver 36b, which respectively drive an H-side motor 29 and an E-side motor 24 based on the motor control signals.

Stored in a memory section 33 is a program for generating an approximate expression in accordance with the operation of the CPU 32. Prior to the automatic impedance matching, an automatic impedance matching device 16 performs an approximate expression generating operation in accordance with the program. This operation will now be discussed.

Figure 30:
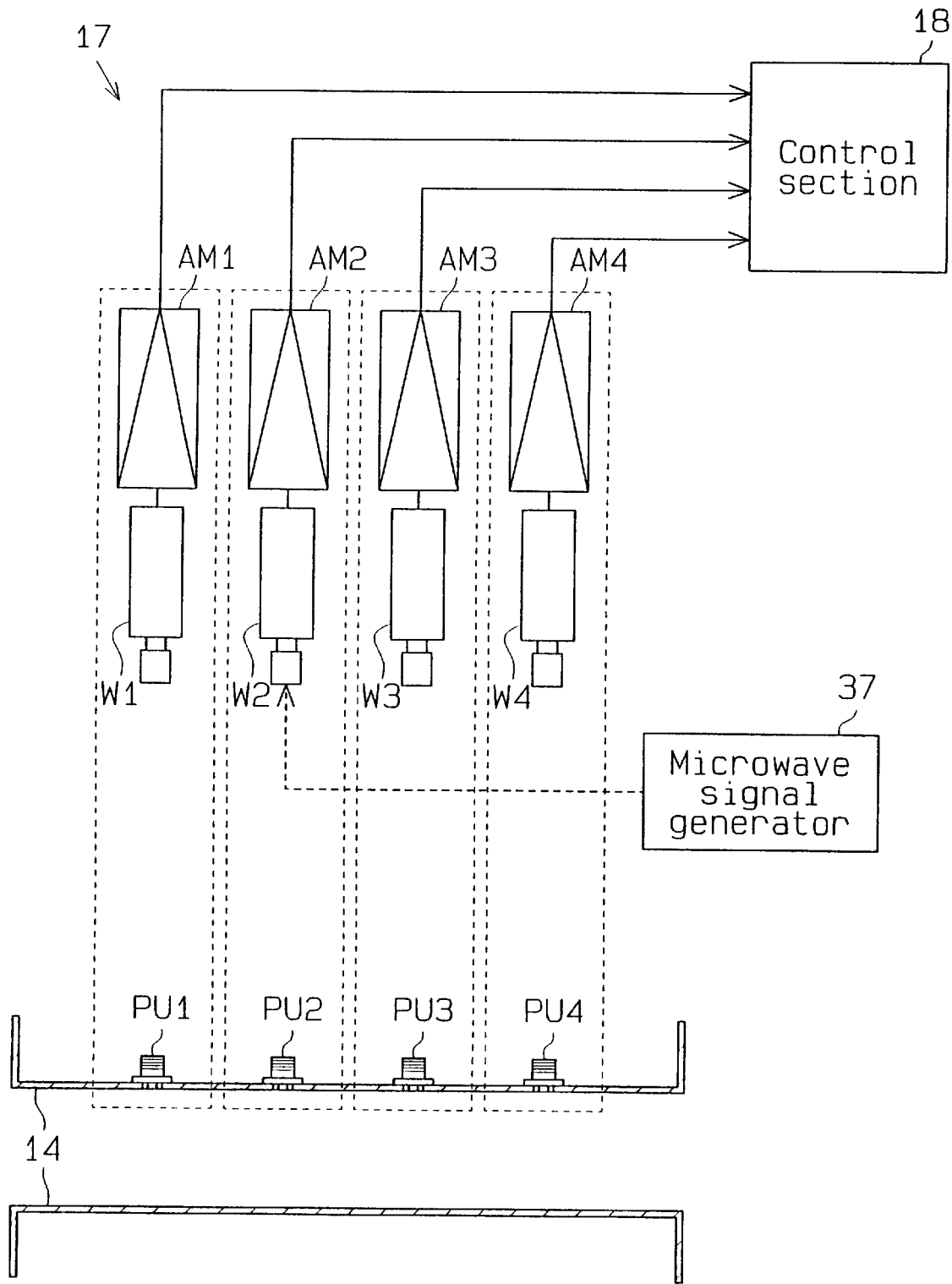
FIG. 30 is an explanatory diagram illustrating a detection section at the time an approximate expression is generated.

As shown in FIG. 30, a detection section 17 comprises detecting diodes W1 to W4, pickups PU1 to PU4 and amplifiers AM1 to AM4. The pickups PU1–PU4 are normally connected to the detecting diodes W1–W4, respectively, and their antenna sections are exposed inside a waveguide 14 to supply the microwave power in the waveguide 14 to the corresponding detecting diodes W1–W4 at given degrees of coupling.

The detecting diodes W1–W4 detect the output powers of the respective pickups PU1–PU4 and send output voltages corresponding to the output powers to the corresponding amplifiers AM1–AM4. The amplifiers AM1–AM4 amplify the output voltages of the detecting diodes W1–W4 and send the amplified voltages to a control section 18.

The detecting diodes W1–W4 are detachably connected to the associated pickups PU1–PU4; in the approximate expression generating operation prior to the automatic impedance matching operation, the detecting diodes W1–W4 are removed from the pickups PU1–PU4.

A plurality of reference powers (dBm) of different levels are sequentially input to the detecting diodes W1–W4 from a microwave signal generator 37, and the control section 18 receives the output voltages output from the amplifiers AM1–AM4. The control section 18 also inputs the reference powers (dBm) via the input/output section 34.

In the control section 18, the output voltages of the amplifiers AM1–AM4 and the reference powers are subjected to A/D conversion by an A/D converter 31 before being input to the CPU 32. The degrees of coupling of the pickups PU1–PU4, which have been measured in advance by a measuring device (e.g., a vector network analyzer), are input to the control section 18 from the input/output section 34.

First Approximation System

Figure 31:
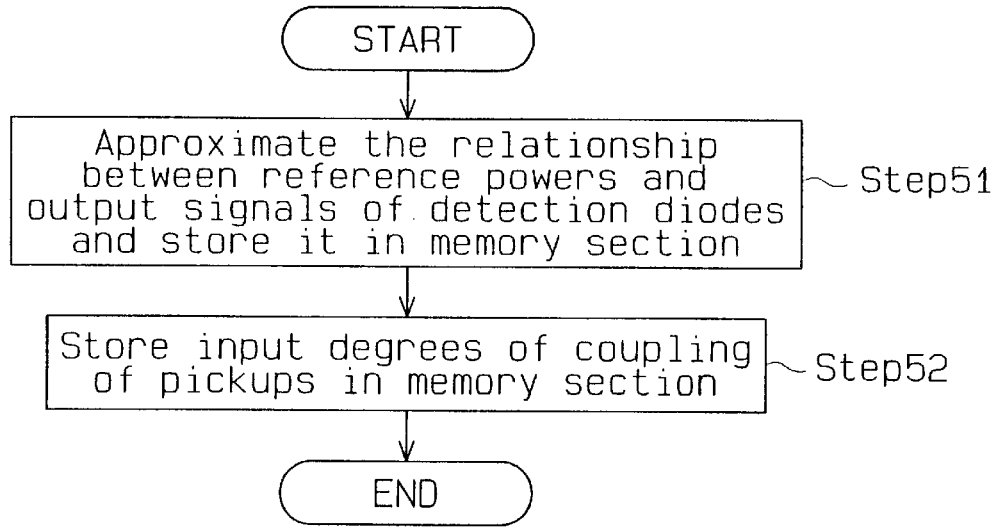
FIG. 31 is a flowchart showing a first approximation system.

The first approximation system will be discussed with reference to FIG. 31. The CPU 32 approximates the relationship between the input reference powers and the output voltages of the detecting diodes W1–W4, diode by diode, using a polynomial approximate expression and stores the resultant approximate expressions in the memory section 33 (step 51). The CPU 32 receives the degrees of coupling of the pickups PU1–PU4 from the input/output section 34 and stores them in the memory section 33 (step 52).

At this time, the input reference powers should have a wider range than the value of the input power in the waveguide 14 obtained during actual usage, and the CPU 32 generates the approximate expressions based on the output voltages of the detecting diodes W1–W4 corresponding to the reference powers. This approximate expression generating process permits more accurate approximate expressions to be generated.

In actual usage, when a microwave is input to the waveguide 14, the CPU 32 computes reference power levels corresponding to the output voltages of the detecting diodes W1–W4 based on the output voltages of the detecting diodes W1–W4 and the previously generated approximate expressions. The CPU 32 then computes power in the waveguide 14 based on the computed reference power levels and the degrees of coupling.

If a polynomial approximate expression is to be generated by using least square, for example, this approximation system requires polynomial approximate expression of about an order of ten for accurate approximation.

Second Approximation System

Figure 32:
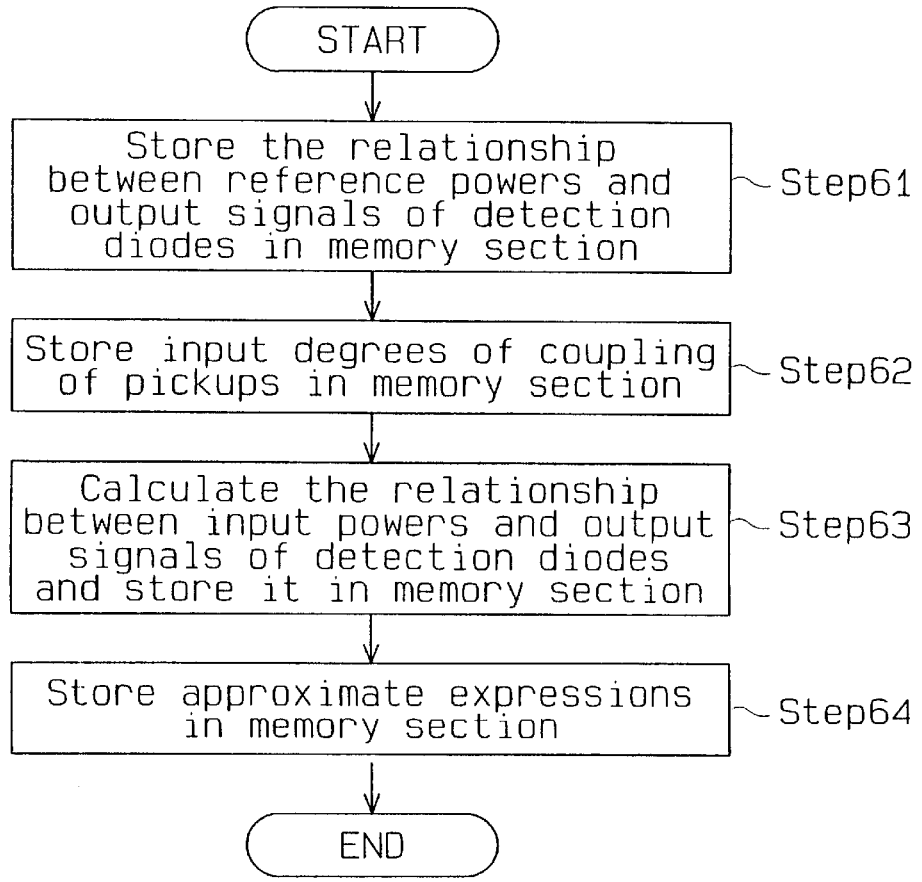
FIG. 32 is a flowchart showing a second approximation system.

The second approximation system will be discussed with reference to FIG. 32. The CPU 32 operates based on the program previously stored in the memory section 33, and stores the relationship between the input reference powers and the output voltages of the detecting diodes W1–W4 in the memory section 33 for the respective detecting diodes W1–W4 (step 61). The CPU 32 receives the degrees of coupling of the pickups PU1–PU4 from the input/output section 34 and stores them in the memory section 33 (step 62). At this time, the input reference powers should have a wider range than the value of the input power in the waveguide 14 obtained in the actual usage, as in the case of the first approximation system.

Then, the CPU 32 computes the power actually input in the waveguide 14 based on the reference powers and the degrees of coupling, computes the relationship between that input power and the output voltages of the detecting diodes W1–W4, and stores the relationship in the memory section 33 (step 63).

Next, the CPU 32 generates a polynomial approximate expression based on the relationship between that input power and the output voltages of the detecting diodes W1–W4, and stores the approximate expression in the memory section 33 (step 64).

In actual usage, when a microwave is input to the waveguide 14, the CPU 32 computes input power in the waveguide 14 corresponding to each of the output voltages of the detecting diodes W1–W4 based on the output voltages of the detecting diodes W1–W4 and the previously generated approximate expression.

In this approximation system, the input power in the waveguide 14 is directly calculated on the basis of the output voltages of the detecting diodes W1–W4 and the approximate expression stored in the memory section 33, so that approximation with a precision as high as or higher than the precision of the first approximation system can be accomplished, even with about a fifth order polynomial approximate expression.

It is therefore possible to directly calculate the input power based on the output voltages of the detecting diodes W1–W4 and to compute the input power from a low order polynomial approximate expression, thus reducing the burden on the CPU 32. This improves the response speed of the automatic impedance matching device at the time of automatic impedance matching.

Figure 33:
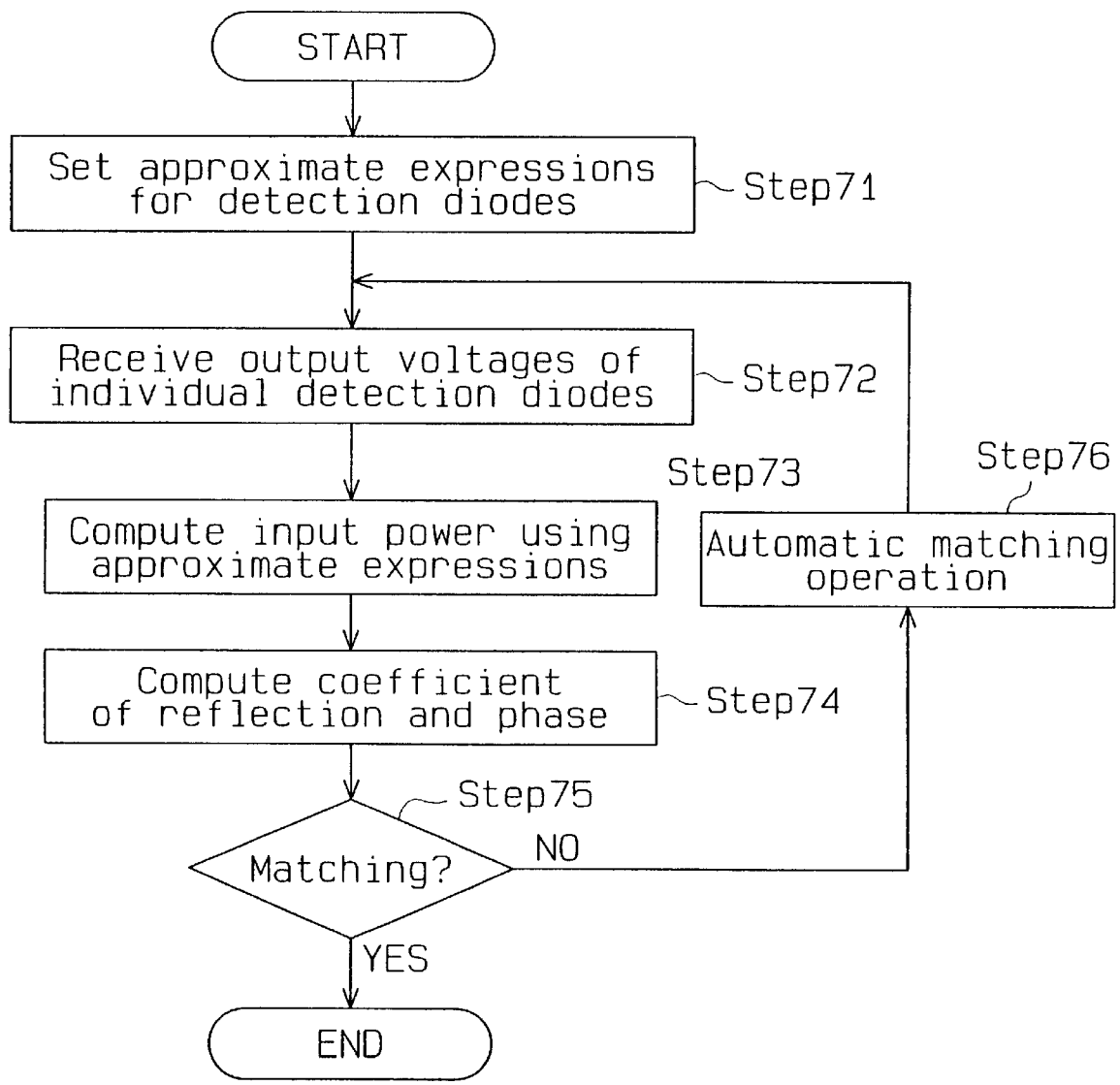
FIG. 33 is a flowchart illustrating an automatic matching operation of an automatic impedance matching device.

The operation of the thus constituted automatic impedance matching device will be briefly explained with reference to FIG. 33.

Before going into the automatic impedance matching operation, approximate expressions for the respective detecting diodes W1–W4 are set based on the above-described approximation systems (step 71).

When a microwave is input to the waveguide 14 under this situation, the CPU 32 receives the output voltages of the individual detecting diodes W1–W4 (step 72) and computes the input power of the microwave input to the waveguide 14 based on the set approximate expressions (step 73).

Then, the CPU 32 calculates the coefficient of reflection and the phase of the input power in the waveguide 14 (step 74) and detects from the calculation results if the impedance of the waveguide 14 matches with the impedance of the load (step 75).

When there is an impedance match, the matching operation is terminated. In the case of no impedance matching, the automatic impedance matching operation is executed (step 76), and, when an impedance match occurs through the repeated processing of steps 72 to 75, the matching operation is terminated.

With reference to FIGS. 21 to 26, the automatic matching operation of the device will now be described.

When a microwave is transmitted to the chamber 15 from the magnetron 11 via the waveguide 14, if there is an impedance mismatch between the waveguide 14 and the chamber 15, a standing wave develops in the waveguide 14.

When the microwave is output from the magnetron 11, the CPU 32 receives, as output voltage data, a voltage output from each of the detecting diodes W1 to W4, which has been converted from the form of analog signal to the form of digital signal by the A/D converter 31 (step 1).

Subsequently, based on the output voltage data of each of the detecting diodes W1 to W4, the CPU 32 determines whether or not the input power exceeds the measuring range, or the dynamic range, of the detecting diodes (step 2). If one of the four detecting diodes W1 to W4 corresponds to the valley of the standing wave SW and the input power exceeds the dynamic range, the detecting diode that corresponds to the valley is removed (step 3). Input power of each of the remaining three detecting diodes is calculated from the output voltage data regarding the remaining diodes and the approximate expression stored in the memory section 33 (step 4).

Next, the CPU 32 uses a known expression to calculate the coefficient of reflection and phase of the standing wave from the calculated input power of the three detecting diodes (step 5).

In contrast, if, in step 2, none of the powers input to the detecting diodes W1 to W4 are determined to exceed the dynamic range, the CPU 32 uses the approximate expression to calculate the input power of each of the detecting diodes W3 to W1 from the output voltage data concerning the detecting diodes W1 to W3 (step 6). Further, the CPU 32 calculates the coefficient of reflection and phase of the standing wave from the calculated input power of the three detecting diodes (step 7).

The CPU 32 then determines whether or not the thus-calculated phase and coefficient of reflection of the standing wave are numerical values representing the state of impedance match (step 8). If there is an impedance match, the matching operation of the matching device is terminated.

If the phase and coefficient of reflection do not represent an impedance match in step 8, the CPU 32 determines the phase of the standing wave from among the region ranging from 0 to 90°, that ranging from 90° to 180°, that ranging from 180° to 270°, and that ranging from 270° to 360° (steps 9 to 11). Impedance matching for the appropriate region is commenced.

Figure 17:
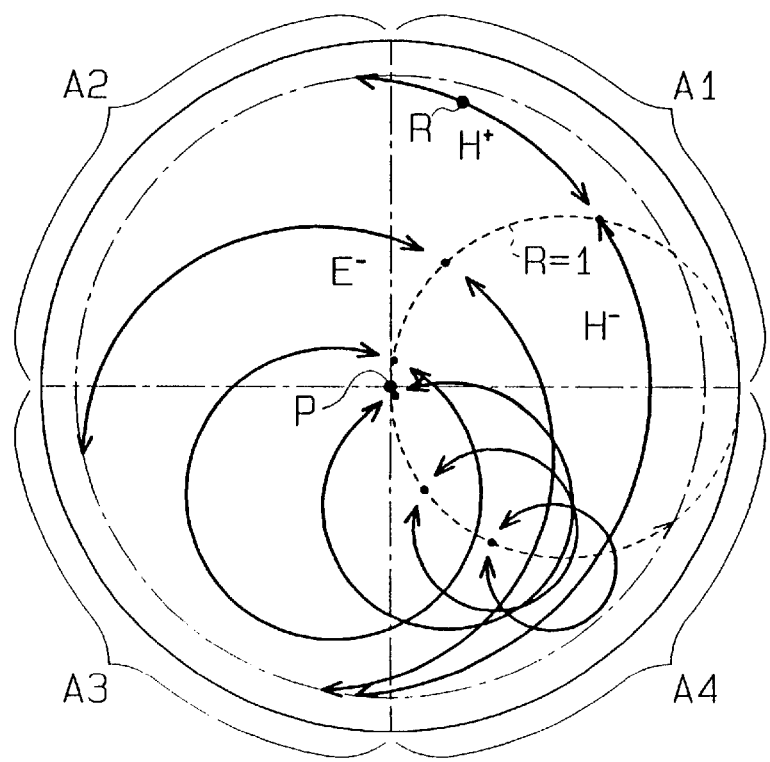
FIGS. 17–20 are explanatory views showing the matching operation of the E-H matching device of the present invention.
Figure 18:
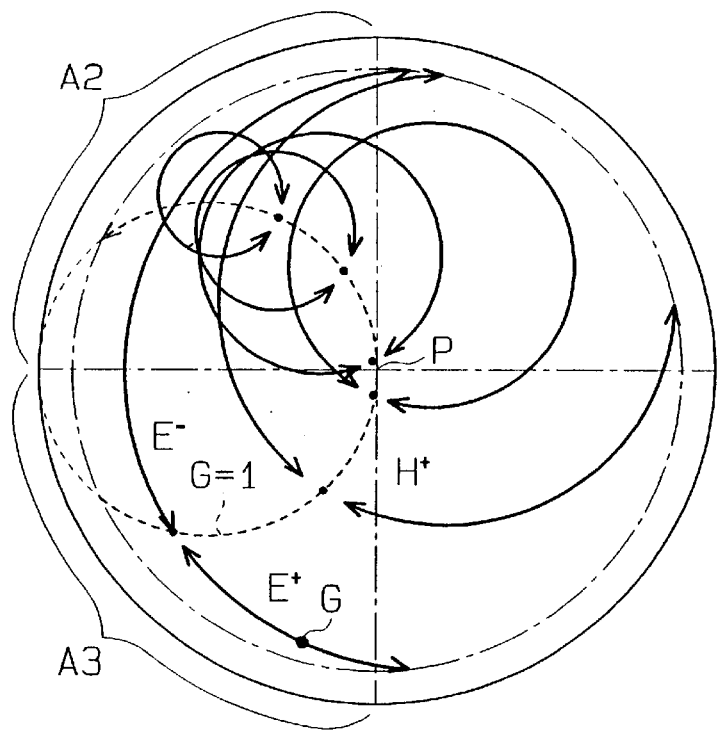

FIGS. 17 and 18 are Smith charts, which represent the impedance calculated from the phase and coefficient of reflection of the standing wave. In a case where the phase is in the region ranging from 0 to 90°, the impedance matching operation is commenced in an area A1 shown in FIG. 17.

The CPU 32 calculates the value of the normalized resistance R on the basis of the impedance calculated from the phase and coefficient of reflection of the standing wave (step 12) and then determines whether or not the normalized resistance R is located on the circle R=1 shown in FIG. 17 (step 13).

If the normalized resistance R is not located on the circle R=1, the CPU 32 determines whether or not the normalized resistance R is larger than 1; namely, whether the normalized resistance R is inside or outside the circle R=1 (step 14). If the normalized resistance R is larger than 1 or if the resistance R is outside the circle R=1, the H-plane plunger 26 is moved toward the positive side, or in an upward direction H⁺ in FIG. 10 (step 15). As a result, the normalized resistance R moves toward the circle R=1. In contrast, if the normalized resistance R is smaller than 1; namely, if the resistance R is inside the circle R=1, the H-plane plunger 26 is moved toward the negative side, or in a downward direction H shown in FIG. 10 (step 16). As a result, the normalized resistance R moves toward the circle R=1.

When the normalized resistance R reaches the circle R=1 as a result of such operations, the CPU 32 moves the E-plane plunger 21 in one direction, namely, in a downward direction E⁻ in FIG. 10 (step 17). As a result, the normalized resistance R travels along the circle R=1 and approaches a point P. If the normalized resistance R has reached the point P, an impedance match is realized, and the CPU 32 terminates impedance matching operations (step 18).

In a case where the phase is in the region ranging from 270° to 360°, the matching operation is performed in an area A4 shown in FIG. 17.

The CPU 32 calculates the value of the normalized resistance R on the basis of the impedance calculated from the phase and coefficient of reflection of the standing wave (step 21) and then determines whether or not the normalized resistance R is located on the circle R=1 shown in FIG. 17 (step 22).

If the normalized resistance R is not located on the circle R=1, the CPU 32 determines whether or not the normalized resistance R is larger than 1; namely, whether the normalized resistance R is inside or outside the circle R=1 (step 23). If the normalized resistance R is larger than 1 or if the resistance R is outside the circle R=1, the H-plane plunger 26 is moved toward the negative side H⁻(step 24).

In contrast, if the normalized resistance R is smaller than 1; namely, if the resistance R is inside the circle R=1, the H-plane plunger 26 is moved toward the positive side H⁺(step 25).

When the normalized resistance R reaches the circle R=1 as a result of such operations, the CPU 32 moves the E-plane plunger 21 toward the positive direction E⁺(step 26). As a result, if the normalized resistance R has reached the point P, the state of an impedance match is realized, and the CPU 32 terminates impedance matching operations (step 27).

In a case where the phase is in the region ranging from 90° to 180°, the impedance matching operation is performed in an area A2 shown in FIG. 18.

The CPU 32 calculates the value of the normalized conductance G on the basis of the impedance calculated from the phase and coefficient of reflection of the standing wave (step 31) and then determines whether or not the normalized conductance G is located on the circle G=1 shown in FIG. 17 (step 32).

If the normalized conductance G is not located on the circle G=1, the CPU 32 determines whether or not the normalized conductance G is larger than 1; namely, whether the normalized conductance G is inside or outside the circle G=1 (step 33). If the normalized conductance G is larger than 1, or if the conductance G is outside the circle G=1, the E-plane plunger 21 is moved toward the negative side E⁻ (step 34).

In contrast, if the normalized conductance G is smaller than 1; namely, if the conductance G is inside the circle G=1, the E-plane plunger 21 is moved toward the positive side E⁺ (step 35).

When the normalized conductance G reaches the circle G=1 as a result of such operations, the CPU 32 moves the H-plane plunger 26 toward the negative direction H⁻ (step 36). As a result, if the normalized conductance G has reached the point P, the state of an impedance match is realized, and the CPU 32 terminates impedance matching operations (step 37).

In a case where the phase is in the region ranging from 180° to 270°, the impedance matching operation is performed in an area A3 shown in FIG. 18.

The CPU 32 calculates the value of the normalized conductance G on the basis of the impedance calculated from the phase and coefficient of reflection of the standing wave (step 41) and then determines whether or not the normalized conductance G is located on the circle G=1 shown in FIG. 18 (step 42).

If the normalized conductance G is not located on the circle G=1, the CPU 32 determines whether or not the normalized conductance G is larger than 1; namely, whether the normalized conductance G is inside or outside the circle G=1 (step 43). If the normalized conductance G is larger than 1, or if the conductance G is outside the lo circle G=1, the E-plane plunger 21 is moved toward the positive side E⁺ (step 44).

In contrast, if the normalized conductance G is smaller than 1; namely, if the conductance G is inside the circle G=1, the E-plane plunger 21 is moved toward the negative side E⁻ (step 45).

When the normalized conductance G reaches the circle G=1 as a result of such operations, the CPU 32 moves the H-plane plunger 26 toward the positive direction H⁺ (step 46). As a result, if the normalized conductance G has reached the point P, the state of an impedance match is realized, and the CPU 32 terminates impedance matching operations (step 47).

In the foregoing impedance matching operations, in order to improve the efficiency of transmission of power to the load by reducing the elapsed time between commencement and termination of the impedance matching operation, the short plungers 21, 26 must be moved at high speed. However, it takes a predetermined period of time for the CPU 32 to calculate the state of reflection of the microwave from the data received from the detector section, and also it takes time for the short plungers 21, 26 to reach stable positions when they are moved. For these reasons, the impedance matching operations can be performed in the following manner.

Figure 19:
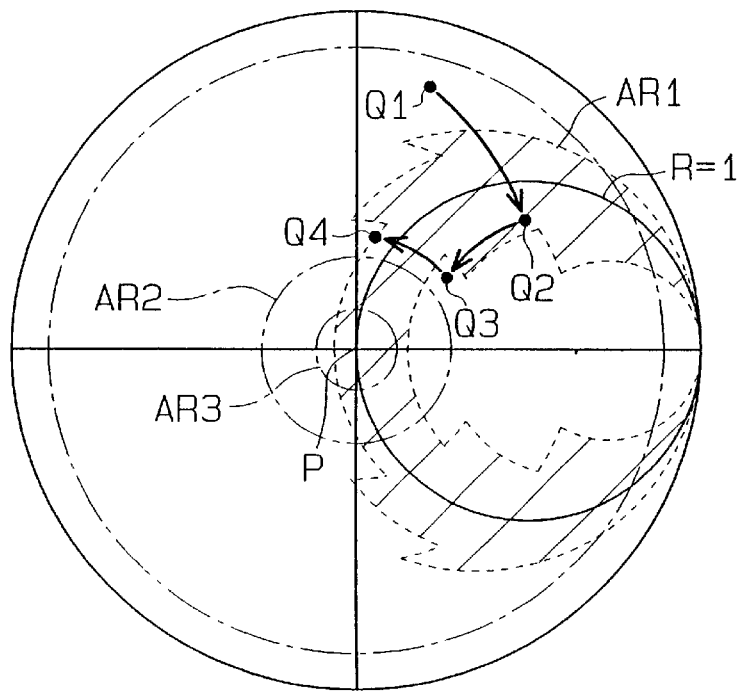

As shown in FIG. 19, an area AR1 including the circle R=1 is set. When high speed movement of the H-plane short plunger 26 causes the normalized resistance R to move, e.g., from Q1 to Q2, so that the normalized resistance R reaches the area AR1, the E-plane short plunger 21 is moved at high speed in a direction in which the reflection is reduced. If the normalized resistance R moves from Q2 to Q3 and is thus outside the area AR1, the H-plane short plunger 26 is moved in such a way that the normalized resistance R returns to a location within the area AR1. As a result, the normalized resistance R moves from Q3 to Q4. Subsequently, the E-plane short plunger 21 is moved at high speed in a direction in which the reflection is reduced. These operations are performed repeatedly.

If the normalized resistance R approaches the matching point P and is within an area AR2, the speed of actuation of the H-plane short plunger 26 and the E-plane short plunger 21 is reduced, and the foregoing operations are then repeated. If the normalized resistance R reaches an area AR3 in the vicinity of the matching point, the matching operations are terminated. Similar operations are carried out with regard to the circle G=1.

Through the above-described operation, the short plungers 21, 26 are moved at high speed such that the normalized resistance R moves within the AR1 so as to gradually approach the area AR2 until the normalized resistance R reaches the inside of the area AR2. Accordingly, in the state where the reflection is large, the normalized resistance R can be immediately moved to the inside of the area AR2 by high-speed actuation of the short plungers.

When the normalized resistance R has reached the inside of the area AR2, the speed of actuation of the plungers 21, 26 is reduced so that the normalized resistance R can accurately move to the inside of the area AR3.

In these matching operations, the range over which the speed of actuation of the short plungers 21, 26 is changed may be divided into a larger number of ranges. Further, the speed of actuation of the H-plane short plunger 26 and that of the E-plane short plunger 21 may be set individually.

The user may set the area AR1 in accordance with the phase of the microwave or as an arbitrary area, instead of setting it to include the circles R=1 and G=1, as in the previous embodiment.

Although the oscillation frequency of the magnetron is set to 2.45 GHz in the previous embodiment, the frequency may slightly deviate from the frequency of 2.45 GHz. In such a case, the wavelength of the standing wave developed in the waveguide 14 also deviates from the distance between the detecting diodes. As a result, a difference arises between the data detected by the detecting diodes and an actual standing wave.

Figure 20:
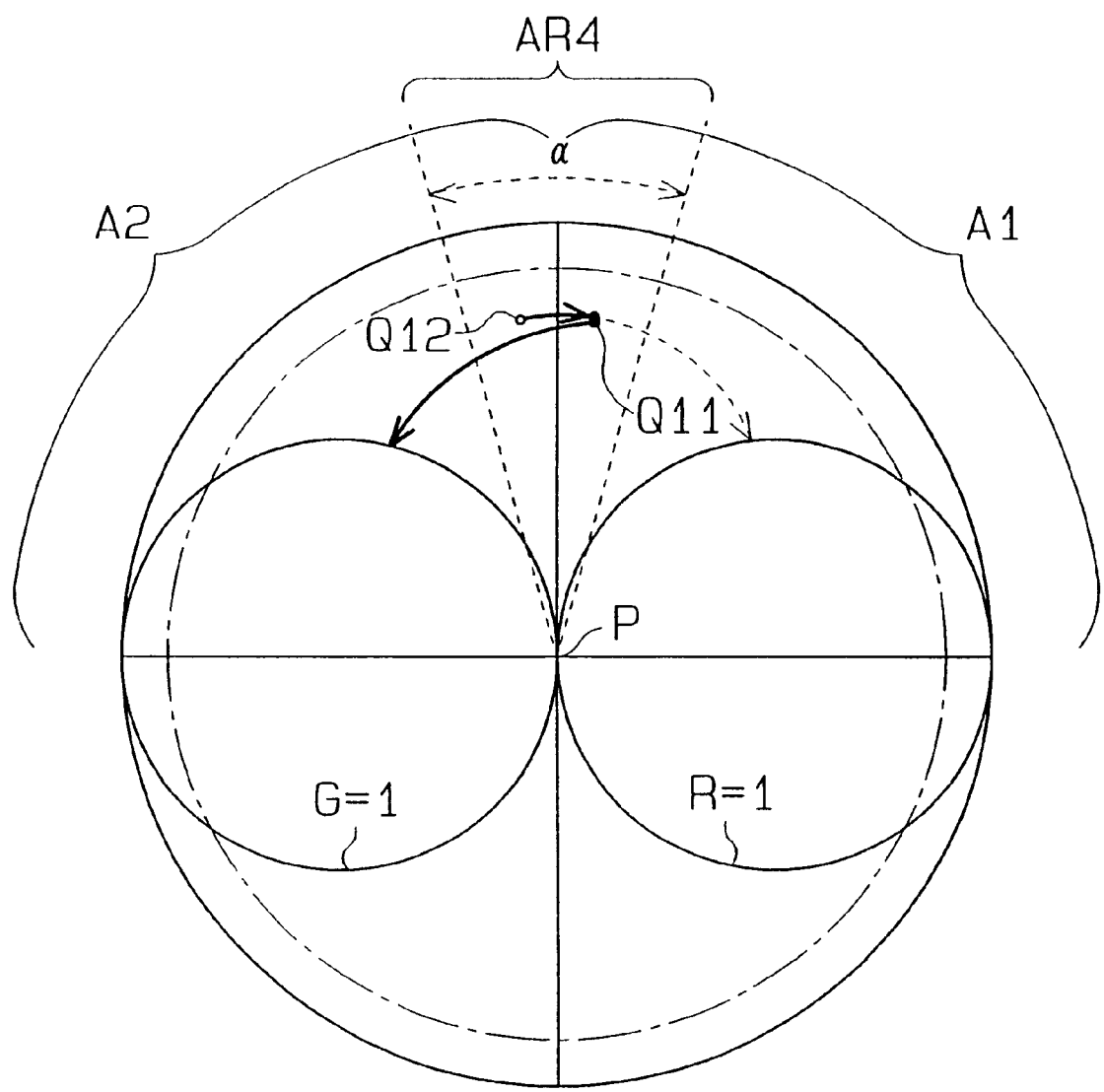
Figure 21:
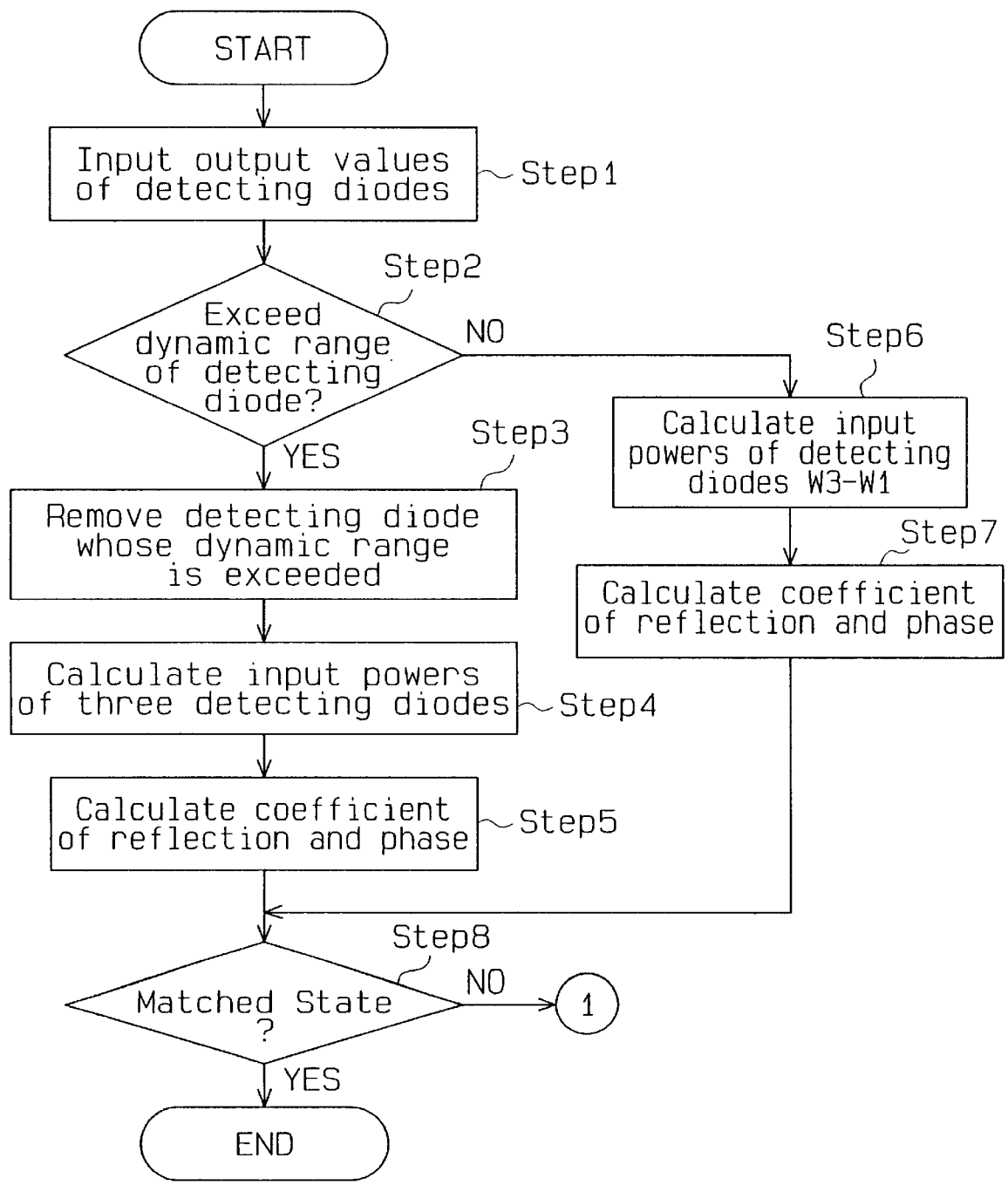
FIGS. 21–26 are flowcharts illustrating the automatic matching operation of the device of the present invention.
Figure 22:
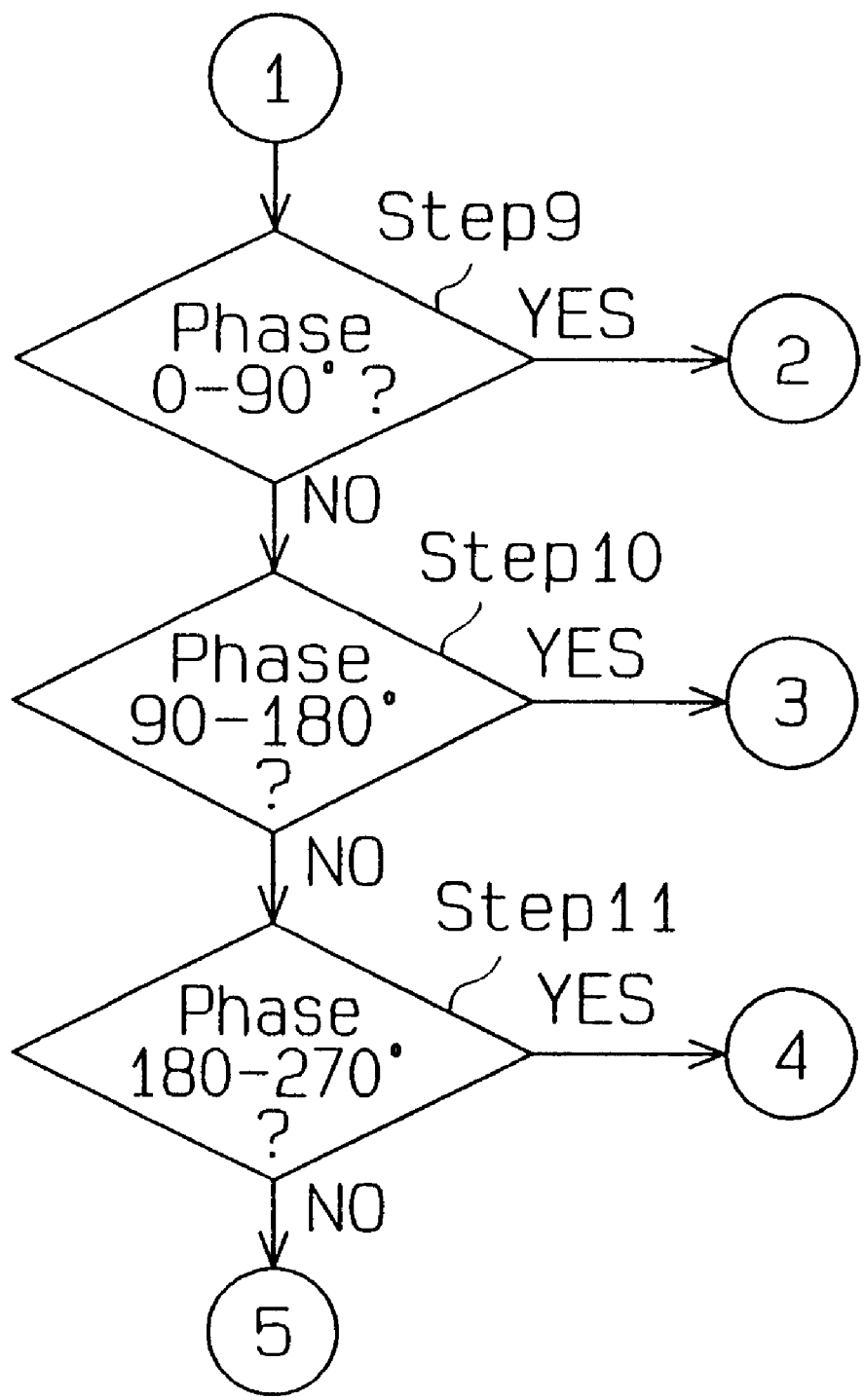
Figure 23:
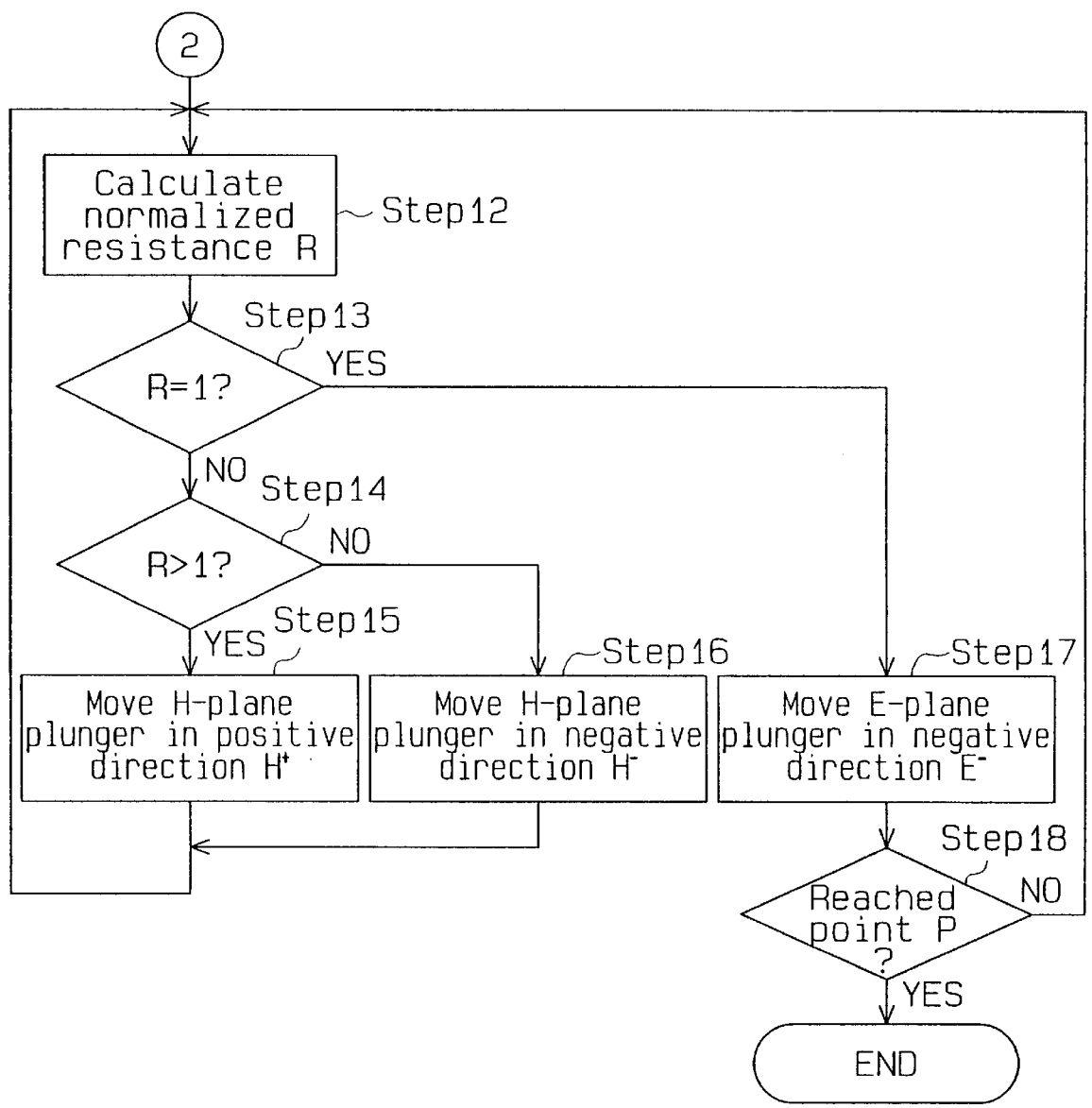
Figure 24:
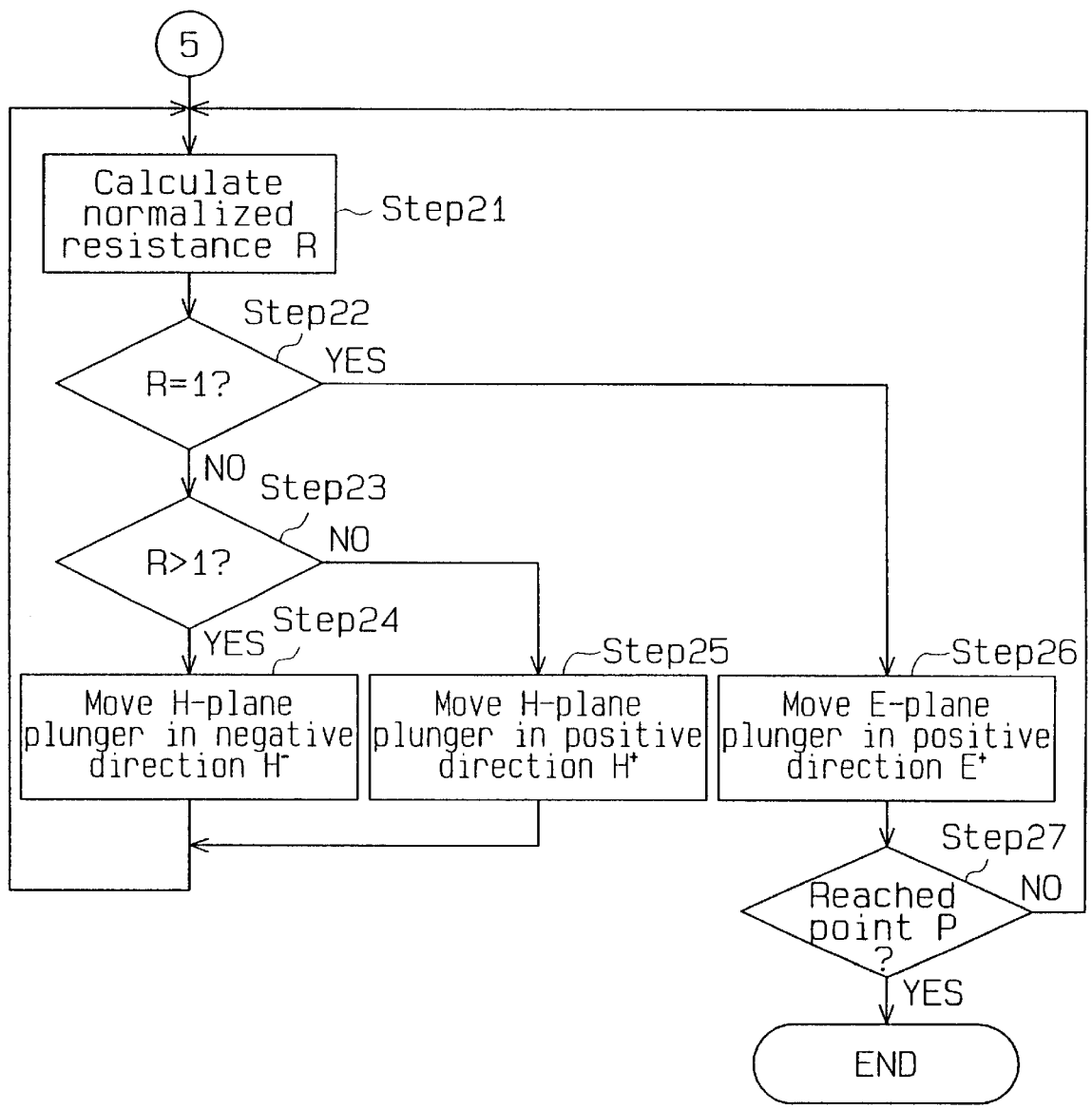
Figure 25:
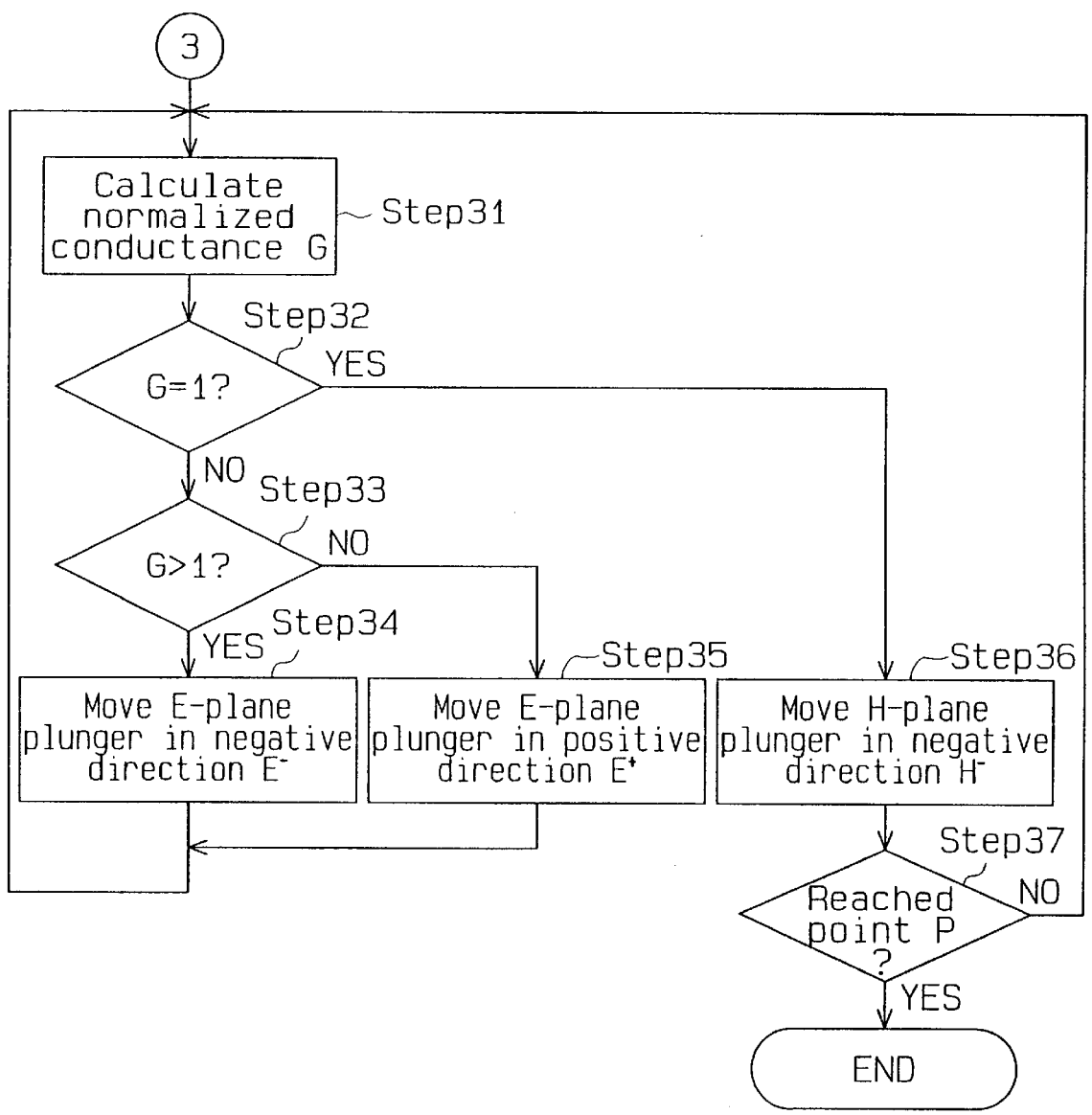
Figure 26:
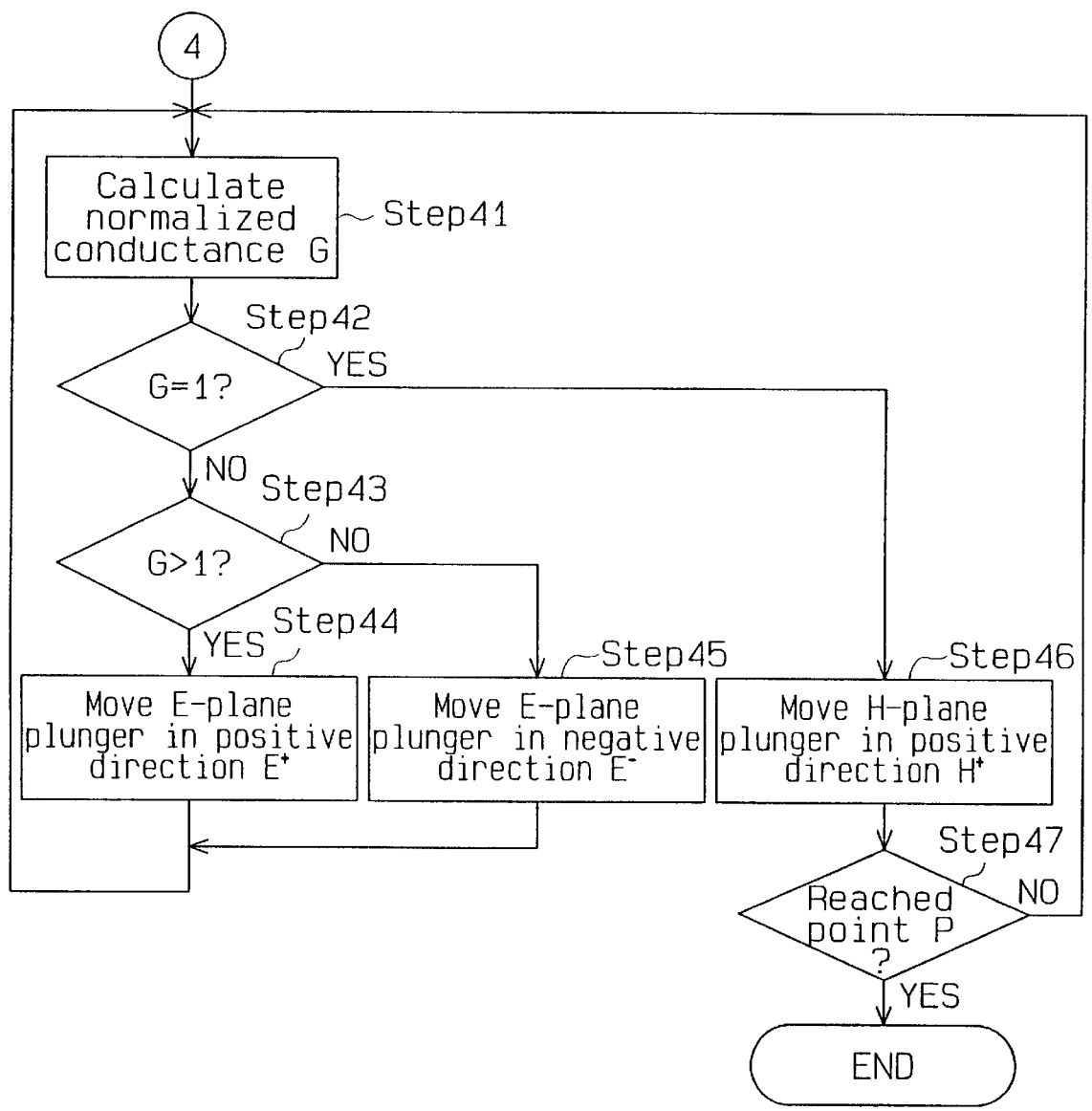

As shown in FIG. 20, for example, a difference arises between an impedance Q11 calculated from the signal received from the detector section and an actual impedance Q12. If the impedance Q11 and the impedance Q12 are located on opposite sides with respect to the interface between the areas A1 and A2, for example, the impedance Q12 is matched to the matching point P within the area A1 thereby lengthening the adjustment time or rendering impedance matching impossible.

In this case, an interface area AR4 having a predetermined phase angle α is set along the interface between the areas A1, A2. If the impedance Q11 and the impedance Q12 are positioned in the interface area AR4 such that they are located on the opposite sides with respect to the interface, the matching device is set to match the impedance Q12 to the matching point P in the area A2 in accordance with the pre-input oscillation frequency data concerning the magnetron. As a result, stable automatic impedance matching operations become feasible.

MODIFICATION OF THE MATCHING DEVICE

Figure 27:
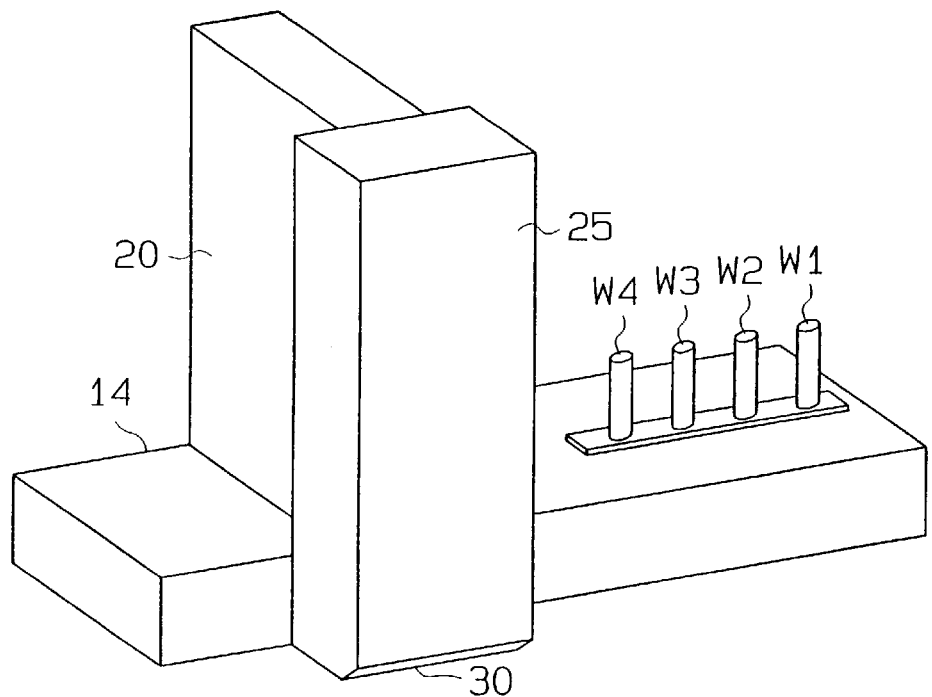
FIG. 27 is a perspective view showing a modification of the E-H matching device in accordance with the present invention.

In the E-H matching device of the foregoing description, the distance between the interior wall of the waveguide and the center of the H-plane branch waveguide equipped with the E-bend is $\lambda g/4$. However, the E-H matching device may be constructed in the following manner:

(1) As shown in FIG. 27, the distance between the waveguide and the H-plane branch waveguide is reduced further until the distance between the interior wall of the waveguide and the center of the H-plane branch waveguide equipped with the E-bend becomes smaller than $\lambda g/4$. With such a configuration, the E-bend can cut off unwanted frequencies to a much greater extent, and the E-H matching device can be made more compact.

Figure 28:
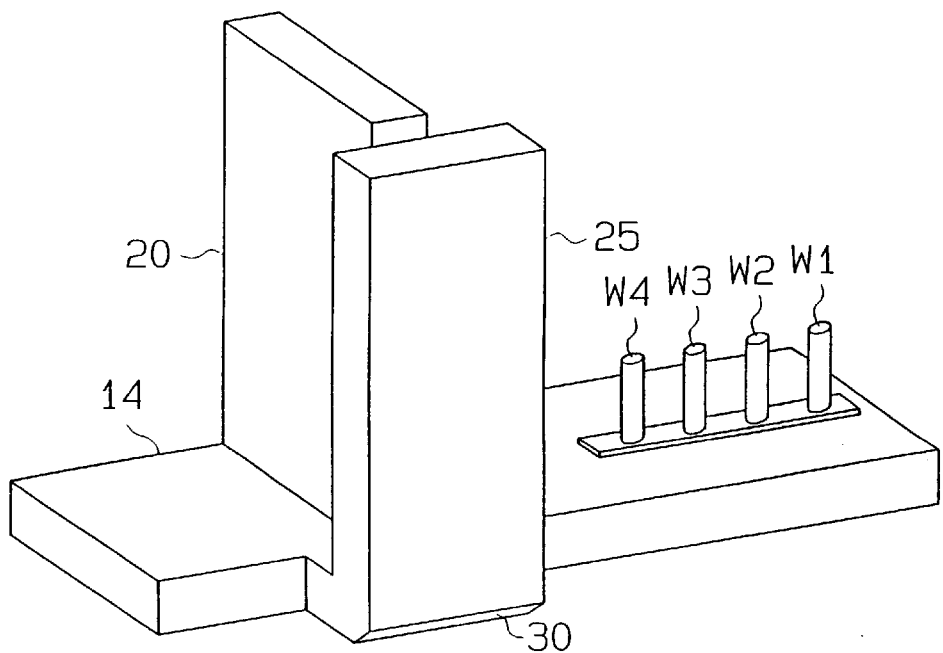
FIG. 28 is a perspective view showing another modification of the E-H matching device in accordance with the present invention.

(2) As shown in FIG. 28, the waveguide, the E-plane branch waveguide, and H-plane branch waveguide may be formed into flattened waveguides. With this configuration, the occurrence of a high-order mode in the interface between the waveguide and the H-plane branch waveguide can be reduced further.

Figure 29:
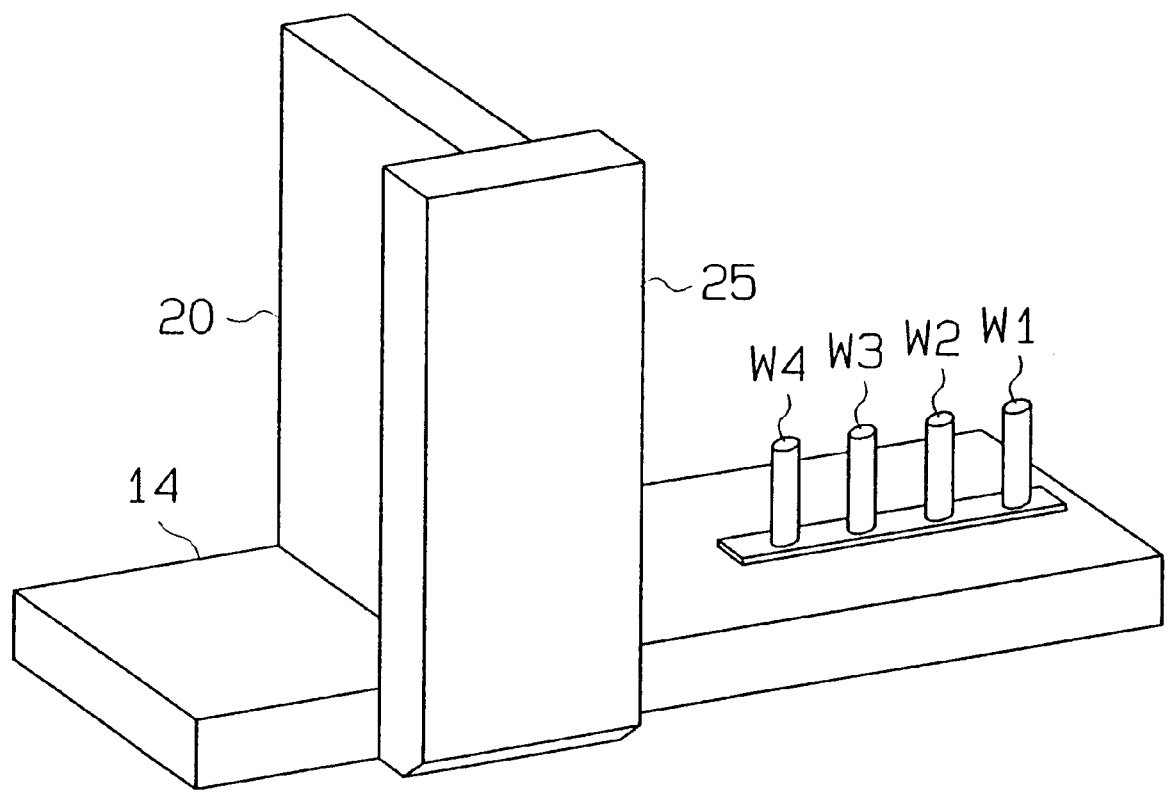
FIG. 29 is a perspective view showing still another modification of the E-H matching device in accordance with the present invention.

(3) As shown in FIG. 29, in an E-H matching device that comprises the waveguide, the E-plane branch waveguide, and the H-plane branch waveguide, all being formed into flattened waveguides, the distance between the interior wall of the waveguide and the center of the H-plane branch waveguide is reduced to $\lambda g/4$ or less by reducing the distance between the waveguide and the H-plane branch waveguide. With this configuration, in comparison with the E-H matching device shown in FIG. 28, the E-H matching device is more compact and is improved with regard to the wavelength-shortening effect and the unwanted-frequency cut-off effect of the E-bend.

The automatic impedance matching device having the foregoing configurations can operate and yield advantageous results in the following manner:

(A) Since the E-bend 30 is provided for the H-plane branch waveguide 25 of the E-H matching device 19 in proximity to the waveguide 14, the three-dimensional circuit is made compact while the power resistance of the impedance matching device is ensured.

Figure 15:
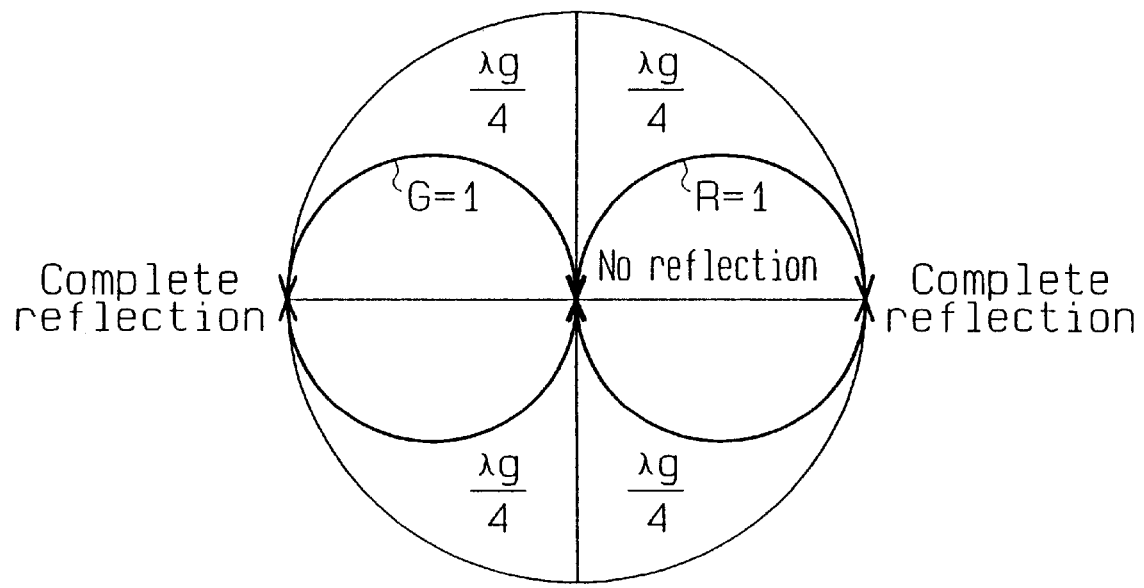
FIG. 15 is an explanatory diagram showing the matching operation of the E-H matching device of the present invention.
Figure 16:
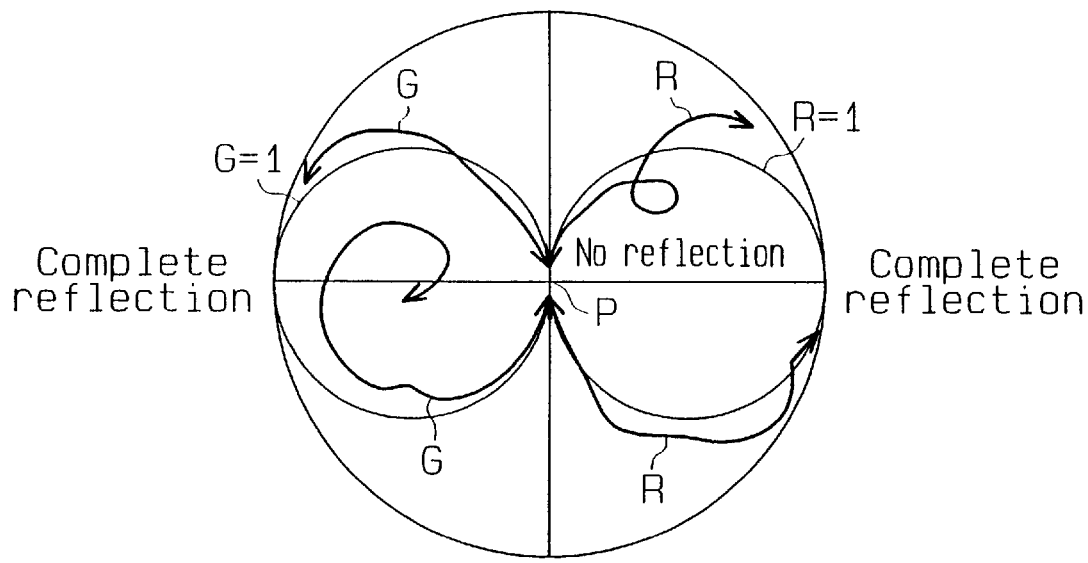
FIG. 16 is an explanatory diagram showing the matching operation of the conventional E-H matching device.

(B) As a result of the E-bend 30 being provided for the H-plane branch waveguide 25 of the E-H matching device 19 in proximity to the waveguide 14, a microwave having a high-order mode occurring in the vicinity of the interface between the waveguide 14 and the H-plane branch waveguide 25 of the E-H matching device is reduced. As shown in FIG. 16, in the conventional E-H matching device, it is difficult to accurately move the normalized resistance R and the normalized conductance G along the respective circles R=1 and G=1, even by adjustment of the E-plane plunger and the H-plane plunger. In contrast, as shown in FIG. 15, the device of the present invention enables the normalized resistance R and the normalized conductance G to accurately move along the circles R=1 and G=1. As a result, automatic impedance matching is controlled accurately and readily.

(C) The distance between the center of the operation range of the H-plane short plunger 26 and the interior of the waveguide 14 is reduced by virtue of the wavelength-shortening effect of the E-bend 30. Accordingly, since the length of the H-plane branch waveguide 25 is shortened, the E-H matching device 19 is more compact.

(D) The detector section 17 is positioned in proximity to the E-H matching device 19 by virtue of the high-order mode propagation reduction effect of the E-bend 30. Accordingly, the three-dimensional circuit can be made more compact.

(E) An approximate expression for each detecting diode is stored in the memory section 33 in advance. This expression is used for calculating the power input to each of the detecting diodes W1 to W4 in accordance with the voltage output from each of the detecting diodes W1 to W4. The CPU 32 calculates the input power on the basis of the voltage output from each of the detecting diodes W1 to W4. Even if there are variations in the output characteristic of each of the detecting diodes W1 to W4, or, if the input power extends over the linear, square curve, and saturation regions of each of the detecting diodes W1 to W4, the input power can be accurately calculated by means of the approximate expression.

Even when the detecting diode is replaced, the replacement of the detecting diode can be performed readily by changing a corresponding approximate expression in conjunction with the replacement of the detecting diode.

(F) Since the four detecting diodes are provided at intervals of $\lambda g/8$, if one of the detecting diodes corresponds to the valley of the standing wave and the input power exceeds the dynamic range of this detecting diode, the remaining three detecting diodes do not correspond to the valley of the standing wave. Hence, the power input to these detecting diodes does not exceed the dynamic range of each of the detecting diodes. Accordingly, the input power of each of the detecting diodes is calculated on the basis of the voltage output from each of the remaining three detecting diodes. As a result, the distribution of power within the waveguide 14, namely, the standing wave, can be reliably detected, which enables correct automatic matching operations.

(G) Where none of the detecting diodes W1 to W4 correspond to the valley of the standing wave, the standing wave is detected in accordance with the voltages output from the three detecting diodes W1 to W3 provided away from the H-plane branch waveguide 25. As a result, the influence of a high-order mode occurring in the interface between the waveguide 14 and the H-plane branch waveguide 25 is reduced further, which enables accurate detection of the standing wave.

(H) When automatic impedance matching operations are performed, the region (A1 to A4) is detected on the basis of the calculated phase of the standing wave, and the load is matched to the impedance matching point P from each region. As a result, the distance over which the E-plane and H-plane short plungers 21, 26 are moved is reduced, which improves the speed of impedance matching operations.

(I) Instead of bringing the normalized resistance R and the normalized conductance G calculated from the phase and coefficient of reflection of the standing wave in alignment with the circle R=1 or G=1, the H-plane and E-plane short plungers 26 and 21 are moved at high speed along the predetermined area AR1 so as to cause the normalized resistance R and the normalized conductance G to approach the area AR2 in the vicinity of the matching point P. The waveguide is immediately changed to the state of a small standing wave from the state of a large standing wave. Accordingly, great reflection losses caused by the standing wave are eliminated, which improves power efficiency. Further, if the oscillation frequency of the magnetron 11 becomes deviated, the impedance matching operations can be performed in such a way that the impedance of the waveguide approaches the matching point P without the influence of the deviation of the oscillation frequency.

(J) If the normalized resistance R and the normalized conductance G are within the predetermined area AR2 in the vicinity of the matching point P as a result of improvements in the state of an impedance match, impedance matching operations can be performed while the speed of actuation of the H-plane and E-plane short plungers 26, 21 is reduced. Impedance matching operations can be accurately performed while the normalized resistance R and the normalized conductance G follow the circles R=1 and G=1. Accordingly, the impedance of the waveguide can be accurately matched to the matching point P.

(K) In the first approximation system, the relationship between the reference powers and the output voltages of the detecting diodes W1–W4 is approximated by disconnecting the detecting diodes W1–W4 from the associated pickups PU1–PU4 and inputting the reference powers to the respective detecting diodes W1–W4 from the microwave signal generator 37. In the actual use of the automatic impedance matching device 16, the reference powers corresponding to the output voltages of the detecting diodes W1–W4 are computed based on the output voltages of the detecting diodes W1–W4 and the approximate expressions, and the input power of the microwave provided to the waveguide 14 is calculated based on the reference powers and the degrees of coupling of the pickups PU1–PU4.

(l) In the second approximation system, the relationship between the output voltages of the detecting diodes W1–W4 and the input power to the waveguide 14 is approximated by disconnecting the detecting diodes W1–W4 from the associated pickups PU1–PU4 and inputting the reference powers to the respective detecting diodes W1–W4 from the microwave signal generator 37. In actual use of the automatic impedance matching device 16, the input power of the microwave input to the waveguide 14 is computed based on the output voltages of the detecting diodes W1–W4 and the approximate expressions. The second approximation system therefore reduces the load on the CPU 32 more than the first approximation system.

(m) To generate approximate expressions, the reference powers have a wider range than the powers that are input to the detecting diodes W1–W4 during actual use. It is therefore possible to generate approximate expressions that accurately approximate the powers to be input in the actual use.

Figure 34:
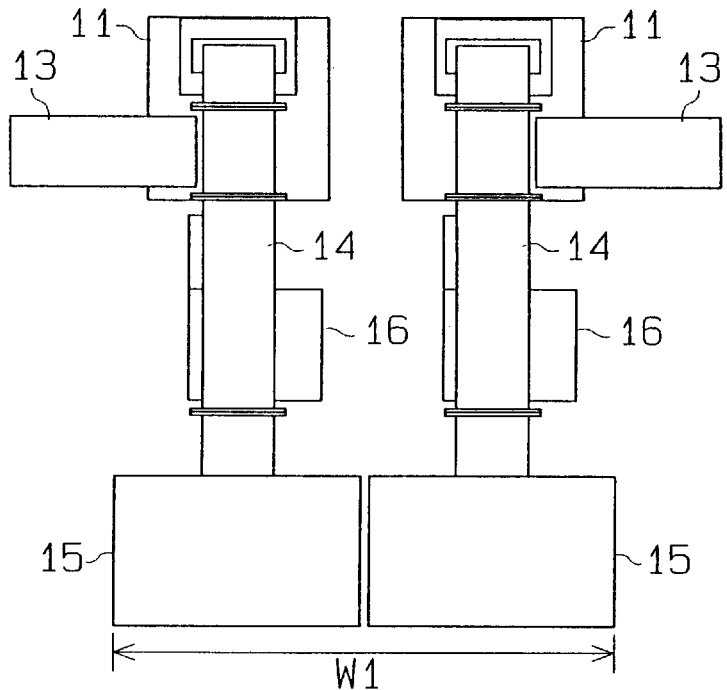
FIG. 34 is a schematic diagram of semiconductor equipment having an automatic impedance matching device according to the invention.
Figure 35:
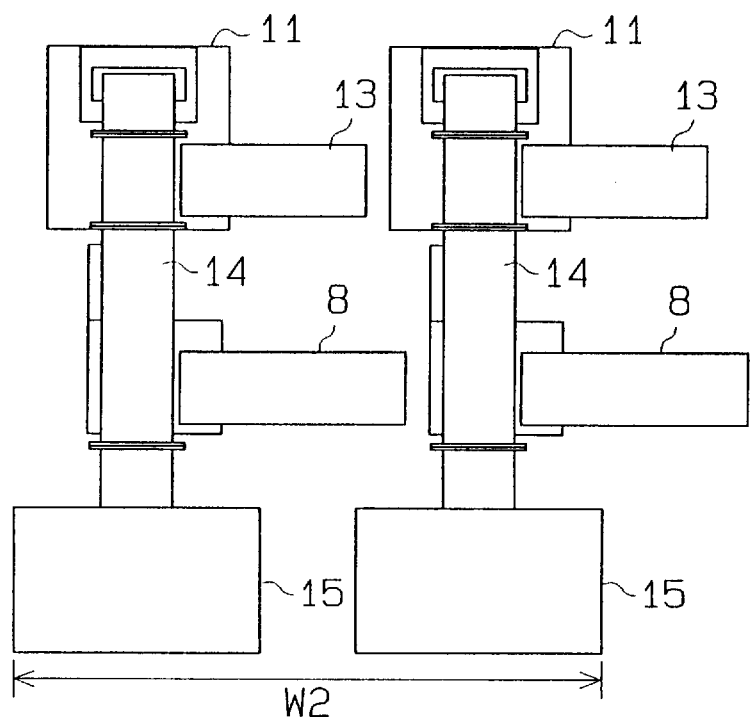
FIG. 35 is a schematic diagram of semiconductor equipment having a conventional automatic impedance matching device.

(n) Since the automatic impedance matching device 16 can be made compact by compactly designing the EH matching device 19 compact, the site space W1 of semiconductor equipment having a plurality of chambers 15 can be reduced as shown in FIG. 34. As shown in FIG. 35, in semiconductor equipment that has the automatic impedance matching devices 8 using the conventional EH matching devices, the H-branch waveguide of the EH matching device significantly protrudes sideways, which requires a larger site space W2. The semiconductor equipment also includes the magnetrons 11, the isolators 13 and the waveguides 14 provided independently with respect to a plurality of chambers 15.

(o) Semiconductor equipment that uses the above-described EH matching device 19 may be embodied as a plasma CVD system, a plasma etching system, a plasma ashing system, a downflow plasma etching system, a downflow plasma ashing system, and ECR plasma etching system, and the like, and can contribute to reducing the site space for those systems.

It should be apparent to those skilled in the art that the present invention may be embodied in many other specific forms without departing from the spirit or scope of the invention. Therefore, the present examples and embodiments are to be considered as illustrative and not restrictive and the invention is not to be limited to the details given herein, but may be modified within the scope and equivalence of the appended claims.

What is claimed is:

1. An E-H matching apparatus for a waveguide body, comprising:
   an E-plane branch waveguide connected to the waveguide body;
   an H-plane branch waveguide connected to the waveguide body; and
   plungers provided in said E-plane branch waveguide and said H-plane branch waveguide, respectively, said plungers being moved to establish impedance matching between the waveguide body and a load,
   wherein said H-plane branch waveguide has a bend portion formed in close proximity to the waveguide body.

2. The E-H matching apparatus according to claim 1, wherein the waveguide body has an interior surface, and wherein the distance between the bend portion and the interior surface is set to about a quarter or less of the wavelength of a microwave transmitted along the waveguide body.

3. The EH matching apparatus as set forth in claim 2, wherein the apparatus is incorporated into equipment for manufacturing a semiconductor apparatus.

4. The apparatus according to claim 3, wherein a plurality of the EH matching apparatuses and a plurality of chambers are incorporated into the equipment.

5. The apparatus according to claim 2, wherein the waveguide body is a flattened waveguide body.

6. The EH matching apparatus as set fourth in claim 5, wherein the apparatus is incorporated into equipment for manufacturing a semiconductor apparatus.

7. The apparatus according to claim 6, wherein a plurality of the EH matching apparatuses and a plurality of chambers are incorporated into the equipment.

8. The EH matching apparatus as set forth in claim 1, wherein the apparatus is incorporated into equipment for manufacturing a semiconductor apparatus.

9. The apparatus according to claim 8, wherein a plurality of the EH matching apparatuses and a plurality of chambers are incorporated into the equipment.

10. An automatic microwave impedance-matching apparatus adapted to a waveguide body transmitting a microwave to a load, said apparatus comprising:

an E-H matching apparatus including an E-plane branch waveguide and H-plane branch waveguide connected to the waveguide body, said E-H matching apparatus further including plungers provided in said E-plane branch waveguide and said H-plane branch waveguide, said plungers being moved to establish impedance matching between the waveguide body and a load, wherein said H-plane branch waveguide has a bend portion formed in close proximity to the waveguide body;

a detector unit for detecting the distribution of power within the waveguide body; and a control unit for receiving a detection result from said detector unit and detecting a standing wave developed as a result of an impedance mismatch between the load and the waveguide body, said control unit further controlling the plungers so as to attenuate the standing wave.

11. The apparatus according to claim 4, wherein said detector unit includes at least three detecting diodes, which are provided at predetermined intervals on the waveguide body, wherein said at least three detecting diodes output voltage signals in accordance with the distribution of power within the waveguide body, and wherein said control unit includes a computing unit, which employs a predetermined approximate expression, for calculating the input power of each detecting diode in accordance with the output voltage of each detecting diode and for calculating the distribution of power within the waveguide body through use of the predetermined approximate expression.

12. The apparatus according to claim 11, wherein said detector unit includes four detecting diodes, and wherein said control unit includes a computing unit, which removes, from the voltages output from four detecting diodes, a voltage that exceeds the dynamic range of said detecting diodes and calculates the distribution of power within the waveguide body in accordance with the voltages output from the remaining three or less detecting diodes.

13. The apparatus according to claim 12, wherein the computing unit calculates the distribution of power within the waveguide body in accordance with the voltages output from three detecting diodes that are closest to said H-plane branch waveguide when none of the output voltages exceed the dynamic range of said detecting diodes.

14. The apparatus according to claim 11, wherein said control unit includes a calculation unit for approximating a relationship between reference powers, which are imposed on said detecting diodes, and output voltages of said detecting diodes, which result from the reference powers, using the reference powers and output voltages.

15. The apparatus according to claim 14, wherein each of said reference powers has a wider range than that of powers provided to said detecting diodes during actual use.

16. The apparatus according to claim 11, wherein said detector unit further includes pickups that are attached to the associated detecting diodes, and wherein said control unit includes a calculation unit for approximating a relationship between reference powers, which are imposed on said detecting diodes, and output voltages of said detecting diodes that result from the reference powers, wherein the approximation uses the reference powers, the output voltages and degrees of coupling of said detecting diodes and said pickups.

17. The apparatus according to claim 16, wherein each of reference powers has a wider range than that of powers imposed on said detecting diodes during actual use.

18. The apparatus according to claim 10, wherein said control unit includes a controller that attenuates the standing wave at high speed by high-speed actuation of said plungers when the detected standing wave is greater than a predetermined level and moves said plungers at low speed when the standing wave is smaller than the predetermined level.

19. The apparatus according to claim 10, wherein said control unit includes a controller to:

calculate the phase and coefficient of reflection of the detected standing wave;

calculate a parameter representing the state of the standing wave from the phase and coefficient of reflection;

set a permissible area having a predetermined range around a characteristic curve, wherein the characteristic curve represents the moving of the parameter to an impedance matching point by moving one of said E-plane and H-plane plungers; and control said E-plane and H-plane plungers in such a way that the parameter moves to the impedance matching point along the permissible area.

20. The automatic microwave matching apparatus as set forth in claim 4, wherein the apparatus is incorporated into equipment for manufacturing a semiconductor apparatus.

21. The apparatus according to claim 20, wherein a plurality of the automatic microwave matching apparatuses and a plurality of chambers are incorporated into the equipment.

22. A method for automatically matching microwave impedance between a load and a waveguide, said method comprising the steps of:

detecting the power of the inside of the waveguide at four or more points defined at intervals corresponding to about one-eighth of the wavelength of a microwave transmitted along the waveguide and generating a plurality of detection signals;

eliminating, from the detection signals, a detection signal associated with one of the points that exceeds a dynamic range of the detection signal;

detecting the standing wave developed in the waveguide in accordance with the remaining detection signals; and attenuating the detected standing wave.

23. A method for automatically matching microwave impedance between a load and a waveguide, said method comprising the steps of:

providing an impedance matching apparatus, connected to the waveguide, for detecting and attenuating a standing wave developed in the waveguide, said impedance matching apparatus including a movable plunger used for attenuating the standing wave;

moving the plunger at high speed when the standing wave is greater than a predetermined level; and moving the plunger at low speed when the standing wave is smaller than the predetermined level.

24. A method for automatically matching microwave impedance between a load and a waveguide, said method comprising the steps of:

providing an impedance matching apparatus, which is connected to the waveguide, including a movable E-plane plunger and a movable H-plane plunger, which are used for attenuating a standing wave developed in the waveguide;

detecting the distribution of power within the waveguide;

detecting the standing wave developed in the waveguide in accordance with the detected distribution of power;

calculating the phase and coefficient of reflection of the detected standing wave;

calculating a parameter representing the state of the standing wave from the phase and coefficient of reflection;

setting a permissible area having a predetermined range around a characteristic curve, wherein the characteristic curve represents the moving of the parameter to an impedance matching point by moving one of said E-plane and H-plane plungers; and controlling the moving of said E-plane and H-plane plungers in such a way that the parameter moves to the impedance matching point along the permissible area.

25. An automatic microwave impedance matching apparatus adapted to a waveguide body that transmits a microwave to a load, said apparatus comprising:

an E-H matching apparatus including an E-plane branch waveguide and an H-plane branch waveguide connected to the waveguide body, each of the E-plane branch waveguide and the H-plane branch waveguide including a plunger therein;

a detector unit for detecting the distribution of power within the waveguide body; and a control unit for receiving a detection result from the detector unit and detecting a standing wave developed as a result of an impedance mismatch between the load and the waveguide body, said control unit controlling each of the plungers to attenuate the standing wave, wherein said detector unit includes at least three detecting diodes, provided at predetermined intervals on the waveguide body, which output voltage signals in accordance with the distribution of power within the waveguide body, and wherein said control unit includes a computing unit which employs a predetermined approximate expression for calculating the input power of each of the detecting diodes in accordance with the output voltage of each of the detecting diodes and for calculating the distribution of power within the waveguide body using the predetermined approximate expression.

26. An automatic microwave impedance matching apparatus adapted to a waveguide body that transmits a microwave to a load, said apparatus comprising:

an E-H matching apparatus including an E-plane branch waveguide and an H-plane branch waveguide connected to the waveguide body, each of the E-plane branch waveguide and the H-plane branch waveguide including a plunger therein;

a detector unit for detecting the distribution of power within the waveguide body; and a control unit for receiving a detection result from the detector unit and detecting a standing wave developed as a result of an impedance mismatch between the load and the waveguide body, said control unit controlling each of the plungers to attenuate the standing wave, and wherein said control unit includes a controller that attenuates the standing wave at high speed by moving said plungers at a high speed when the detected standing wave is greater than a predetermined level and moving said plungers at a low speed when the detected standing wave is less than the predetermined level.

27. An automatic microwave impedance matching apparatus adapted to a waveguide body that transmits a microwave to a load, said apparatus comprising:

an E-H matching apparatus including an E-plane branch waveguide and an H-plane branch waveguide connected to the waveguide body, each of the E-plane branch waveguide and the H-plane branch waveguide including a plunger therein;

a detector unit for detecting the distribution of power within the waveguide body; and a control unit for receiving a detection result from the detector unit and detecting a standing wave developed as a result of an impedance mismatch between the load and the waveguide body, said control unit controlling each of the plungers to attenuate the standing wave, wherein said control unit includes a controller to:

calculate the phase and coefficient of reflection of the detected standing wave;

calculate a parameter representing the state of the standing wave from the phase and coefficient of reflection;

set a permissible area having a predetermined range around a characteristic curve, wherein the characteristic curve represents the moving of the parameter to an impedance matching point by moving one of said E-plane and H-plane plungers; and control said E-plane and H-plane plungers such that the parameter moves to the impedance matching point along the permissible area.

* * * * *

UNITED STATES PATENT AND TRADEMARK OFFICE
CERTIFICATE OF CORRRECTION

PATENT NO. : 5,939,953
DATED : August 17, 1999
INVENTOR(S) : Toshiya Yogo, et al.

It is certified that error appears in the above-identified patent and that said Letters Patent is hereby corrected as shown below:

On the title page, insert item [56]:

U. S. PATENT DOCUMENTS

| EXAMINER INITIAL | PATENT NUMBER | ISSUE DATE | PATENTEE | CLASS | SUBCLASS | FILING DATE IF APPROPRIATE |
|---|---|---|---|---|---|---|
|  | 5 3 5 3 1 2 1 | 10/4/94 | Young et al. | 725 | 52 |  |

OTHER REFERENCES *(Including Author, Title, Date, Pertinent Pages, Etc.)*

"Web TV And Its Consumer Electronics Licensees Debut First Internet Television Network And Set Top Box", Available from Internet, 10 July 1996, XP002086521; http://webtv.net/company/media_center/lice; nse.html HIRTZ G et al: "OPEN TV: BETRIEBSSYSTEM FUER INTERAKTIVES FERNSEHEN", FERNSEH UND KINOTECHNIK, vol. 50, no. 3, 1 Mardch 1996, pages 84-89, XP000581417, page 85, left-hand column, paragraph 4 - right-hand column, paragraph 2

RICHARD K. et al: "GUI WEB BROWSERS" UNIX REVIEW, 1 July 1995, pages 69-74, XP000600159, page 71, left-hand column, paragraph 2

"Netscape Handbook: Before you begin", available from INTERNET, 29 April 1996, XP002086522, page 5, paragraph 1

Signed and Sealed this

Twenty-seventh Day of March, 2001

Attest:

NICHOLAS P. GODICI

Attesting Officer

Acting Director of the United States Patent and Trademark Office